US012610543B2

(12) United States Patent
Wang

(10) Patent No.: US 12,610,543 B2
(45) Date of Patent: Apr. 21, 2026

(54) SELF-ALIGNED FLOATING GATE FORMATION IN NONVOLATILE MEMORY DEVICE FABRICATION

(71) Applicant: FS-SEMI SEMICONDUCTOR CORPORATION, LTD., Hukou Tonwship (TW)

(72) Inventor: Lee Wang, Hukou Township (TW)

(73) Assignee: FS-SEMI SEMICONDUCTOR CORPORATION, LTD., Hukou Township, Hsinchu County (TW)

( * ) Notice: Subject to any disclaimer, the term of this patent is extended or adjusted under 35 U.S.C. 154(b) by 405 days.

(21) Appl. No.: 18/465,194

(22) Filed: Sep. 12, 2023

(65) Prior Publication Data

US 2024/0381633 A1    Nov. 14, 2024

(30) Foreign Application Priority Data

May 12, 2023    (CN) .......................... 202310535399.2

(51) Int. Cl.
*H10B 41/30* (2023.01)
*G11C 16/04* (2006.01)
*H01L 21/768* (2006.01)

(52) U.S. Cl.
CPC ......... *H10B 41/30* (2023.02); *G11C 16/0483* (2013.01); *H01L 21/76831* (2013.01)

(58) Field of Classification Search
CPC ........ H10B 41/30; H10B 69/00; H10B 41/35; G11C 16/0483; H01L 21/76831; H10D 64/035; H10D 30/6892
See application file for complete search history.

(56) References Cited

U.S. PATENT DOCUMENTS

| | | | | |
|---|---|---|---|---|
| 5,880,008 A | * | 3/1999 | Akiyama | ........... H10D 30/0411 |
| | | | | 438/444 |
| 2003/0139010 A1 | * | 7/2003 | Wang | ..................... H10B 41/40 |
| | | | | 438/257 |
| 2005/0112821 A1 | * | 5/2005 | Kim | ...................... H10B 41/40 |
| | | | | 438/258 |

(Continued)

FOREIGN PATENT DOCUMENTS

| | | | | |
|---|---|---|---|---|
| CN | 102623319 A | | 8/2012 | |
| KR | 20080012060 A | * | 2/2008 | ......... H10D 84/0147 |
| KR | 20080024373 A | * | 3/2008 | ........... H10D 30/681 |

*Primary Examiner* — Mohammed Shamsuzzaman
(74) *Attorney, Agent, or Firm* — Muncy, Geissler, Olds & Lowe, P.C.

(57) ABSTRACT

A method for forming floating gates in a non-volatile memory array is disclosed, comprising: patterning and etching portions of a hard-mask dielectric layer, a conductive layer and a tunneling oxide layer to define stacked structures over a substrate; conformally depositing a spacer dielectric layer over the substrate; etching a portion of the spacer dielectric layer to form spacers along sidewalls of each stacked structure; etching a portion of the substrate to form trenches so that the trenches and the stacked structures are alternately arranged in each row; and, growing liners on silicon walls of the trenches. Here, the hard-mask dielectric layer and the spacer dielectric layer comprise an oxidation-blocking material. Accordingly, the poly-silicon floating-gates are encapsulated in the hard-mask dielectric layer and the spacers such that the shapes of floating-gates and the tunneling oxide thickness are well preserved.

7 Claims, 25 Drawing Sheets

Field oxides (320)

(56)                    References Cited

U.S. PATENT DOCUMENTS

2006/0110880  A1 *    5/2006   Yuan ...................... H10B 69/00
                                                      438/257
2008/0293207  A1 *   11/2008   Koutny, Jr. ........ H10D 84/0128
                                                      257/E21.409
2023/0345717  A1 *   10/2023   Shih ................... H10D 30/6892

* cited by examiner

Poly-Silicon 2 (170)

Coupling Dielectrics (150)

Poly-silicon 1 (110)

Tunneling oxides (140)

Field oxides (160)

Silicon substrate (10)

Shallow Trench Isolation (160)

Trench Liner (161)

Device failure point due to two mask misalignment in fabrication process

120

10

Poly-silicon (221)

Tunneling oxides (210)

Hard mask dielectric (230)

Oxidation blocking
Dielectric (240)

Oxide liners (310)

Field oxides (320)

Nitride hard mask (231)

Nitride blocking film (241)

Oxide liners (611)

Field oxides (711)

Nitride blocking film (201)

Oxide liners (282)

SELF-ALIGNED FLOATING GATE FORMATION IN NONVOLATILE MEMORY DEVICE FABRICATION

BACKGROUND OF THE INVENTION

Field of the Invention

The invention relates to the fabrication method for floating-gate Non-Volatile Memory (NVM) devices. In particular, the process method of this invention resolves the tunneling oxide non-uniformity of NVM cell devices in memory arrays caused by the floating-gate over-oxidation in the self-aligned floating-gate/Shallow Trench Isolation (STI) process for the conventional floating-gate non-volatile memory device fabrication. The self-aligned floating-gate/STI process of this invention not only dramatically improves the floating-gate NVM devices' tunneling oxide uniformity but also extends the capability to scale down the cell device sizes of the floating-gate NVM devices to the minimum feature sizes provided by the advanced nanometer fabrication process technology.

Description of the Related Art

Semiconductor Non-Volatile Memory, and particularly Electrically Erasable, Programmable Read-Only Memories (EEPROM), exhibit wide spread applicability in a range of electronic equipment from computers, to telecommunication hardware, to consumer appliances. In general, EEPROM serves a niche in the NVM space as a mechanism for storing firmware and data that can be kept even with power off and can be altered as needed.

Data is stored in an EEPROM cell device by modulating the threshold voltage (device on/off voltage) of the Metal-Oxide-Semiconductor Field Effect Transistor (MOSFET) through the injection of charge carriers into the charge-storage layer from the substrate of the MOSFET device. For example, with respect to an N-channel MOSFET device, an accumulation of electrons in the conducting floating-gate, or in a dielectric layer, or in nano-crystals above the FET channel region, causes the MOSFET device to exhibit a relatively high threshold voltage state. Data is erased in an EEPROM cell device by removing the stored charges from the storage layer.

Flash EEPROM may be regarded as a specifically configured EEPROM into cell array that may be erased only on a global or sector-by-sector basis. Flash EEPROM arrays are also categorized as NOR flash array (parallel connections) and NAND flash array (series connections) according to the configurations of the memory cell device connections in the flash memory arrays. Since the flash EEPROM with poly-silicon floating-gate 110 for charge storage shown in FIG. 1 provides high quality of reliable non-volatile data storage the fabrication process technology for floating-gate NVM devices has become the major manufacturing method for NAND flash memory and NOR flash memory.

While in the road of scaling down flash memory for higher density and lower manufacturing cost, the alignment has become the most critical issue for the two process masking steps regarding the formation of floating-gates 110 and the formation of memory device active areas (devices' channel regions 120) in the sub-micron floating-gate NVM fabrication process technology. As the cross-section view of floating-gate NVM devices in memory array shown in FIG. 2, the two-mask misalignment between floating-gates 110 and device active areas 120 in the memory array could cause devices' functional failure leading to low yields in flash memory manufacturing. To resolve the misalignment issue and improve the flash memory yields, a self-aligned floating-gate/Shallow Trench Isolation (STI) process was first introduced in the sub-micron fabrication process technology. The self-aligned floating-gate/STI process applying only one single floating-gate/active-area mask provides the process method to form floating-gates and memory device active areas in one masking step.

Referring to FIGS. 3-4, the process flow brief for the conventional self-aligned floating-gate/STI process are the followings: (1) well formation of NVM device cell array by ion implantation; (2) tunneling oxide 140 grown on the silicon substrate 10 for NVM devices' tunneling oxide; (3) poly-silicon film 110 deposited on top of tunneling oxide 140 for NVM devices' floating-gate; (4) N-type impurity implanted into the poly-silicon film 110 for floating-gate conductivity; (5) dielectric material film deposited on the poly-silicon 110 for the etching hard mask (not shown); (6) the floating-gate/STI mask applied to etch the dielectric material film to form the hard mask patterns (not shown); (7) RIE (Reactive Ion Etch) sequence to etch poly-silicon 110/tunneling oxide 140/silicon substrate 10 for forming the self-aligned floating-gates 110 and the shallow trenches 130 as the cross-section view as shown in FIG. 3; (8) high temperature (ranging from 750° C.~1100° C.) oxidation process applied for the formation of oxide liners 161 along the shallow trench walls as shown in FIG. 4; (9) oxides deposited on to silicon wafer for filling the shallow trenches 130; (10) Chemical Mechanical Polish (CMP) polishing the filled oxides to flatten the silicon wafer surface; (11) field oxide recess etch to the level height of silicon substrate 10; (12) hard mask (not shown) stripped to complete the whole self-aligned floating-gate/STI process.

While the conventional self-aligned floating-gate/Shallow Trench Isolation (STI) process has resolved the misalignment issue for NVM devices' floating-gates and active areas, the other fabrication issue in the self-aligned floating-gate/STI process caused by the floating-gate oxidation in the high temperature oxidation process for the formation of trench liners (step (8) in the above process flow brief) has also arisen for the smaller geometrical in the nanometer fabrication process technology. As seen in FIG. 4, the oxide shapes of the so-called birds' beaks are grown to enlarge the thickness of tunneling oxide 140 near the poly-silicon floating-gate edges and shrink the poly-silicon floating-gate dimensions. The somehow less controllable over-grown oxides for the poly-silicon floating-gates 110 have the tremendous impact on the uniformity of NVM cell devices in memory arrays. In some extreme cases, the floating-gate NVM device with irregular shapes of floating-gate could fail devices' electrical operations (read, programming, and erase) totally, specially for the operations applied with the Fowler-Nordheim tunneling scheme. The irregular shapes of floating-gates for the floating-gate NVM devices in memory array are also one of the major barriers for floating-gate flash memory to scale down the cell device size to the minimum feature sizes provided by the advanced nanometer fabrication process technology.

To resolve the floating-gate over-oxidation issue in the STI trench liner formation process, we add oxidation blocking dielectric spacers along the side walls of floating-gates to encapsulate the poly-silicon floating gates from oxidization during trench oxide liner formation such that the tunneling oxide thickness and the original after-etched floating-gate dimensions are preserved. The added process of this invention can further extend the device scaling capability to the minimum feature cell sizes provided by the advanced nanometer fabrication process technology.

SUMMARY OF THE INVENTION

In order to illustrate the basic idea of this invention, we show the snap shots of silicon cross-section views in the memory arrays after different process steps (from FIG. 5 to FIG. 11) for the self-aligned floating-gate/STI process. FIG. 5 shows the cross-section view of silicon wafer in the memory arrays after the process of (1) well formation, (2) growing tunneling oxide 210, and (3) depositing poly-silicon film 221. A hard mask dielectric film 230 is then deposited on top of the ploy-silicon film 221. The floating-gate/STI mask is applied to etch the hard mask dielectric film 230 to leave a patterned hard mask (not shown). According to the patterned hard mask, a RIE etch sequence is applied to etch the ploy-silicon film (floating-gate) 221 and tunneling oxide 210 stopping at silicon substrate 10 to form multiple parallel and spaced-apart stacked structures 20A as the cross-section view shown in FIG. 6. A dielectric film 240 with oxidation blocking capability is conformally deposited on the silicon surfaces 10 as the cross-section view shown in FIG. 7. The oxidation blocking dielectric film 240 is then etched to form oxidation blocking dielectric spacers 250 along the side walls of the floating-gates 221 (or the side walls of the stacked structures 20A) as shown in FIG. 8. The RIE for silicon continues to etch the silicon substrate 10 to form the shallow trenches 30 as shown in FIG. 9. With the oxidation blocking dielectric spacers 250 on the side walls of floating-gates 221, the trench oxide liners 310 is grown on the trench silicon walls by an oxidation process as shown in FIG. 10. The oxidation process for growing the trench oxide liners 310 includes, but is not limited to, silicon oxidation process, the high temperature (ranging from 750° C.~1100° C.) oxidation process, and ISSG (In-Situ Steam Generation). Any existing or yet-to-be developed oxidation process may be used for growing the trench oxide liners 310. FIG. 11 shows the final cross-section view of the floating-gates 221 and the device active areas after (1) oxide deposition for filling trenches, (2) CMP for flattening the silicon surface, (3) oxide recess etch for leveling field oxides 320 to the silicon substrate 10, and (4) hard mask dielectric film 230 and oxidation blocking dielectric spacers 250 stripped. Note that due to the oxidation blocking dielectric spacers 250 along the floating-gate side walls (or the side walls of the stacked structures 20A) and the hard mask dielectric film 230 on top of floating-gates 221, the encapsulated floating-gate ploy-silicon are not oxidized during the trench oxide liner formation process such that the shapes of floating-gates 221 and the tunneling oxide thickness are well preserved.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

The following detailed description is meant to be illustrative only and not limiting. It is to be understood that other embodiment may be utilized and element changes may be made without departing from the scope of the present invention. Also, it is to be understood that the various dielectric material for hard mask and oxidation blocking dielectric material for spacers used herein are for the purpose of description and should not be regarded as limiting. Any existing or yet-to-be developed oxidation-blocking material may be used for hard mask 230 and spacers 240. Those of ordinary skill in the art will immediately realize that the embodiment of the present invention described herein in the context of methods and schematics are illustrative only and are not intended to be in any way limiting. Other embodiment of the present invention will readily suggest themselves to such skilled persons having the benefits of this disclosure.

Figure 1:
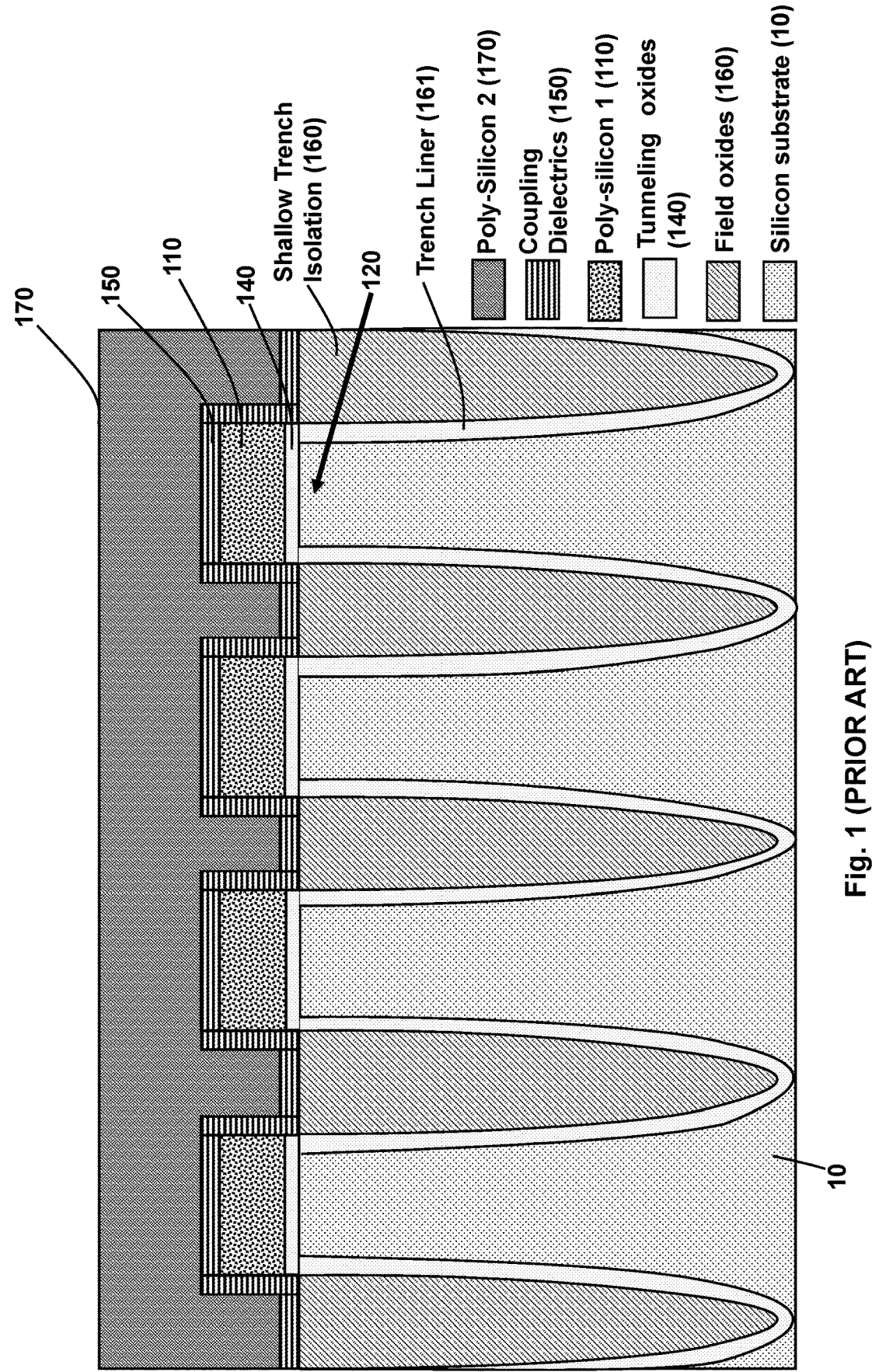
FIG. 1 shows the cross-section views of conventional floating-gate NVM devices in memory array.
Figure 2:
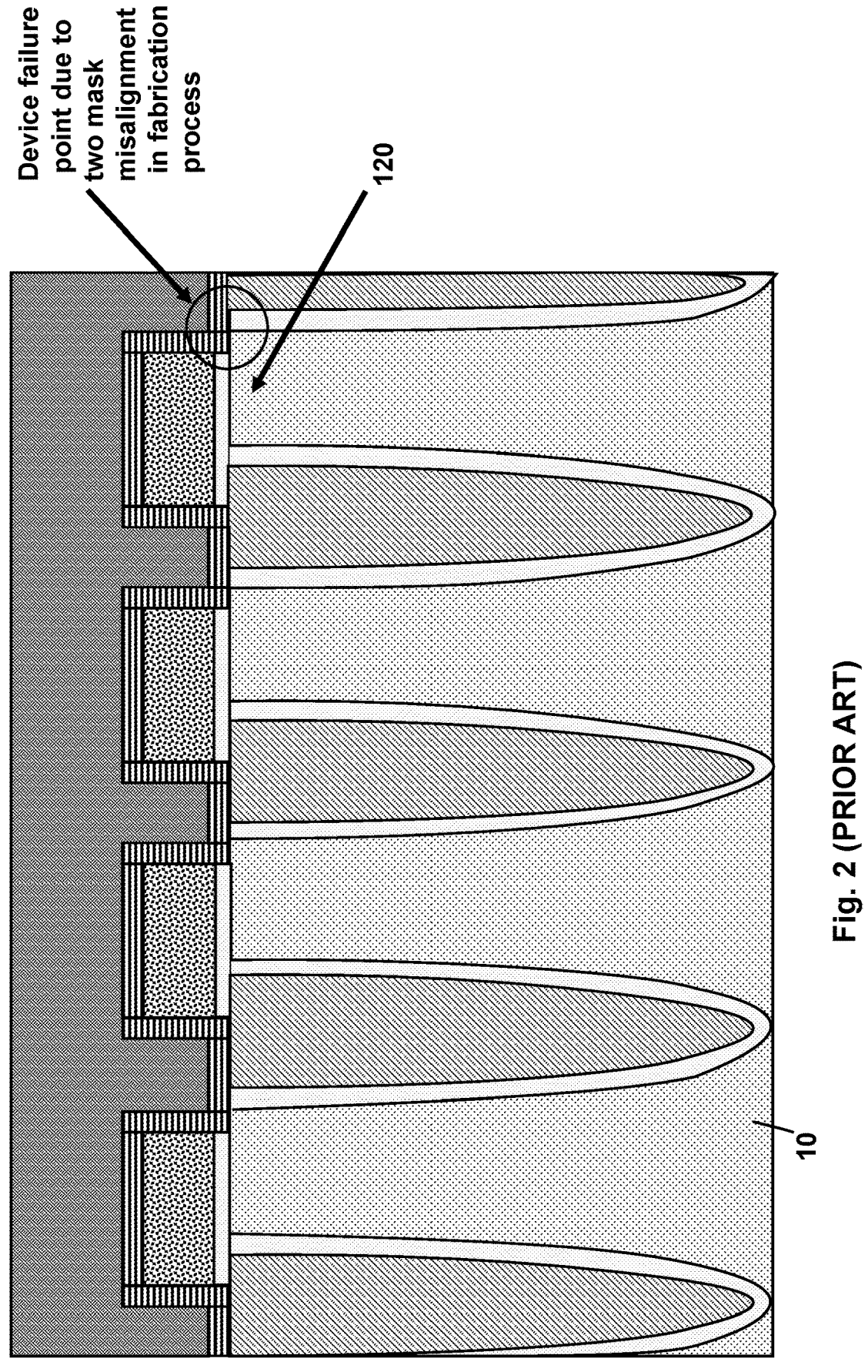
FIG. 2 illustrates the NVM device failure points due to the mis-alignment between two masking steps for the formation of floating-gates and the formation of device active areas according to the prior arts.
Figure 3:
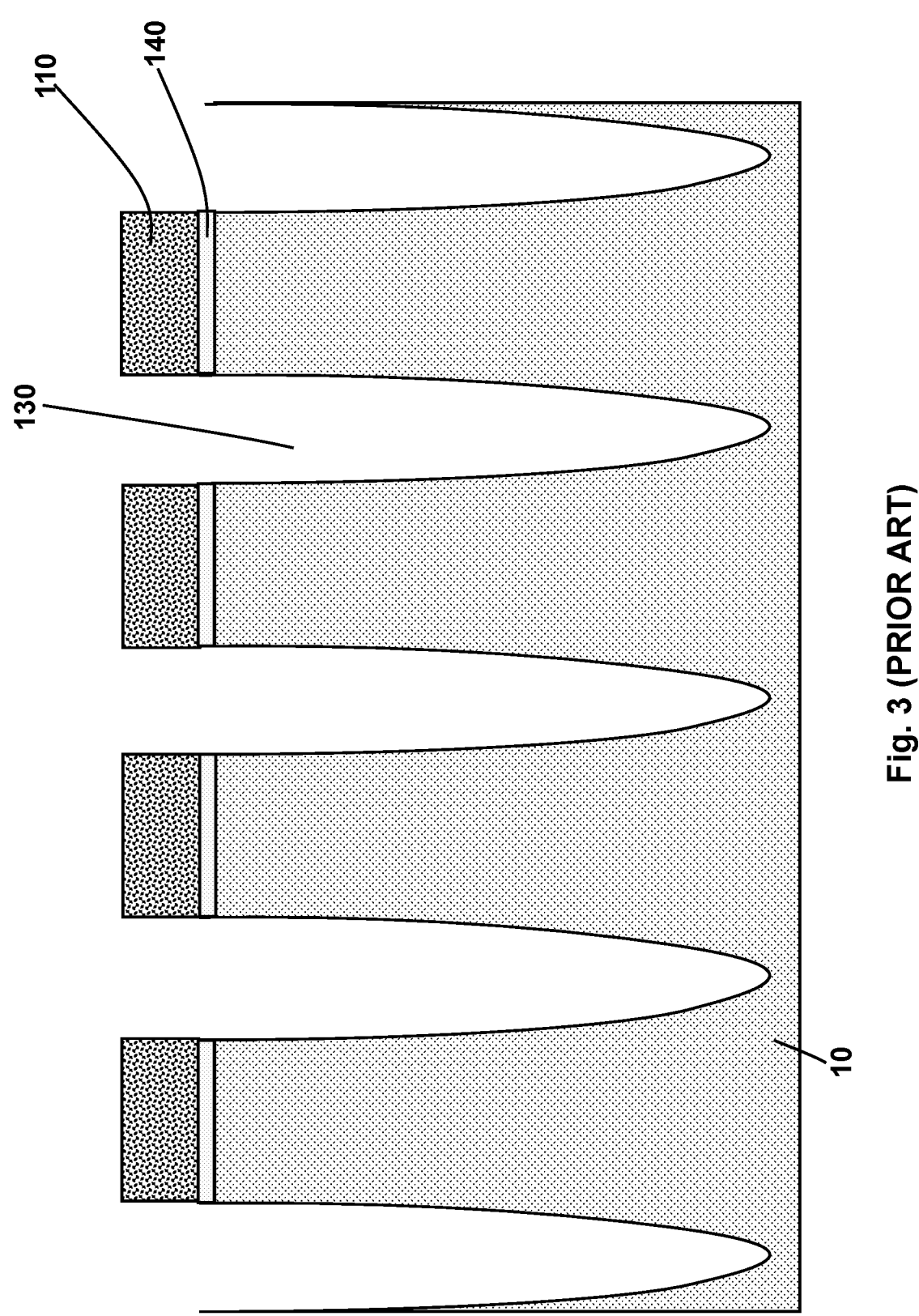
FIG. 3 shows the cross-section view for the floating-gates and device active areas in memory array after applying the self-aligned floating-gate/STI etch sequence according to the prior arts.
Figure 4:
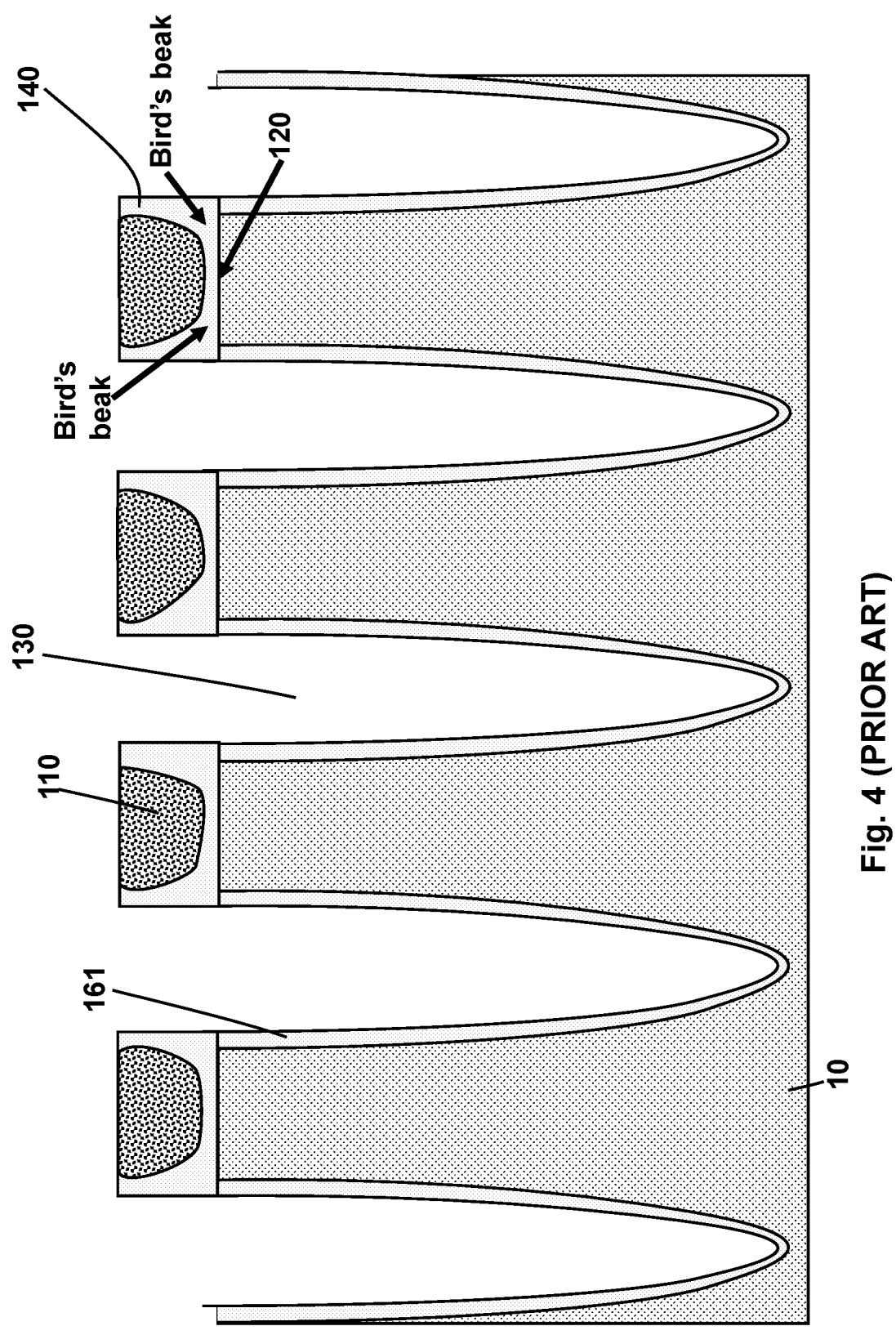
FIG. 4 illustrates cross-section view of the irregular floating-gates in memory array caused by the floating-gate oxidation in the trench liner formation process according to the prior arts.
Figure 5:
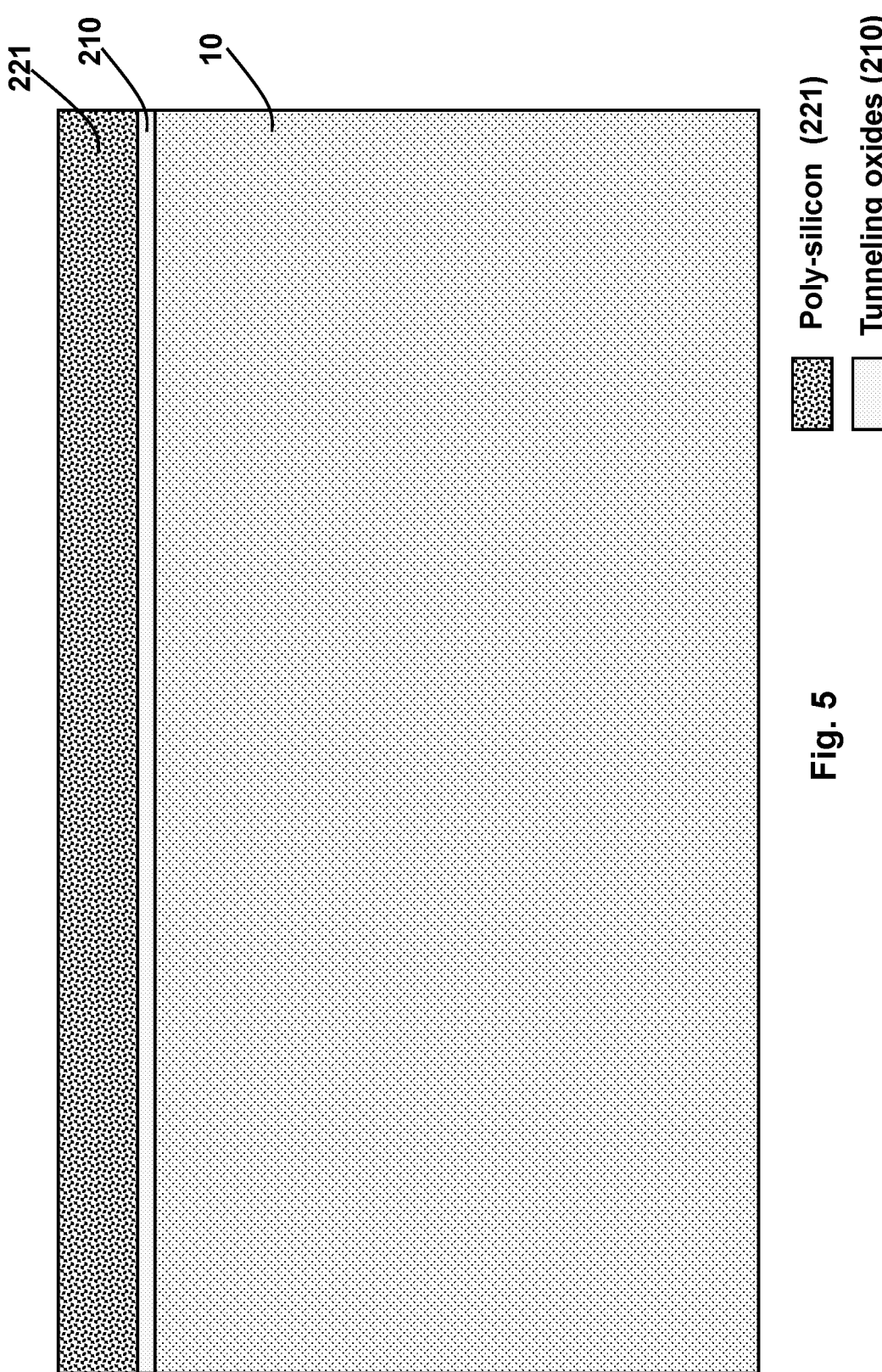
FIG. 5 shows the starting wafer cross-section view after well formation, tunneling oxide grown, and ploy-silicon deposition process according to this invention.
Figure 6:
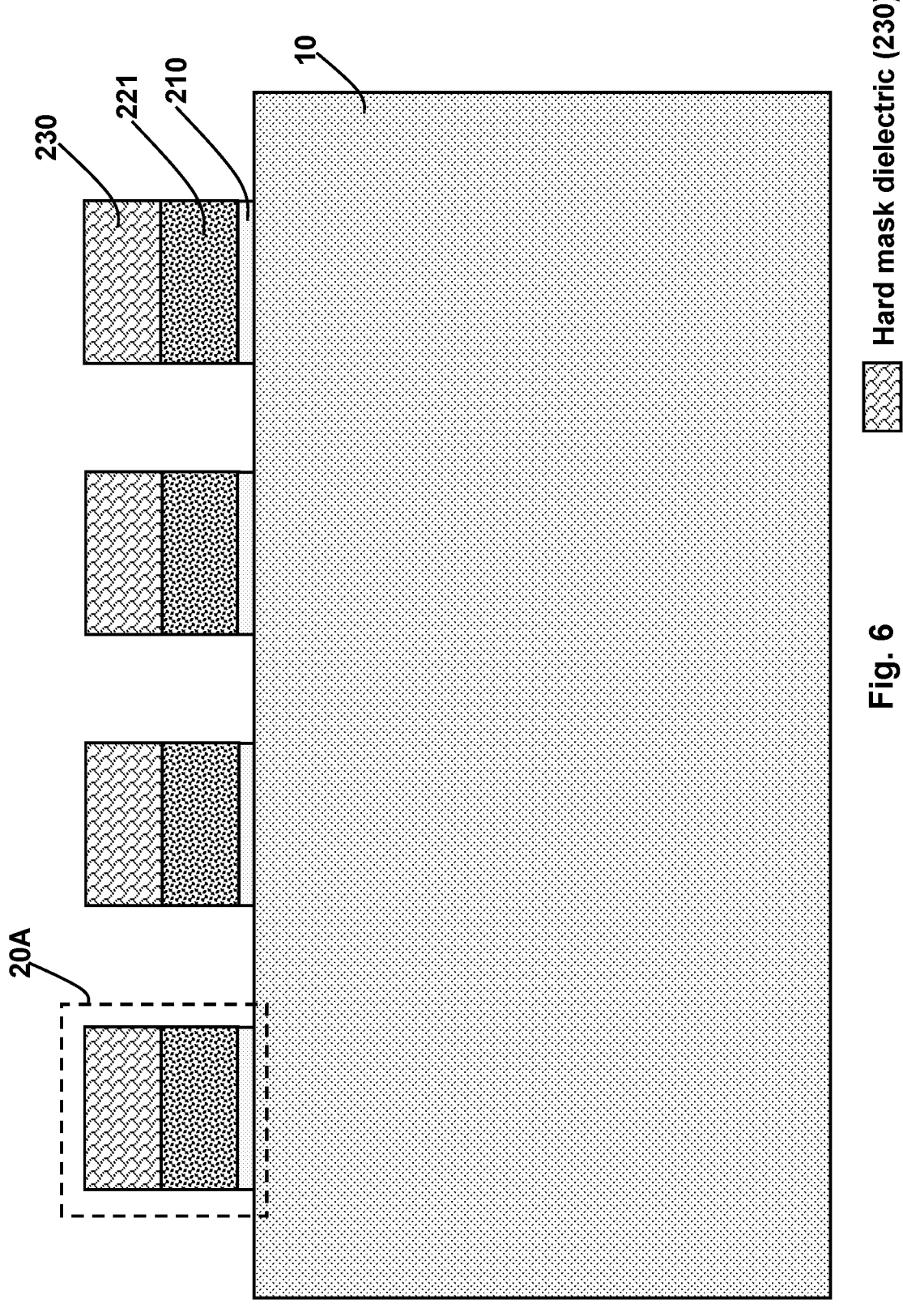
FIG. 6 shows the cross-section view in memory arrays after hard mask patterning/etch and poly-silicon/tunneling oxide etch according to this invention.
Figure 7:
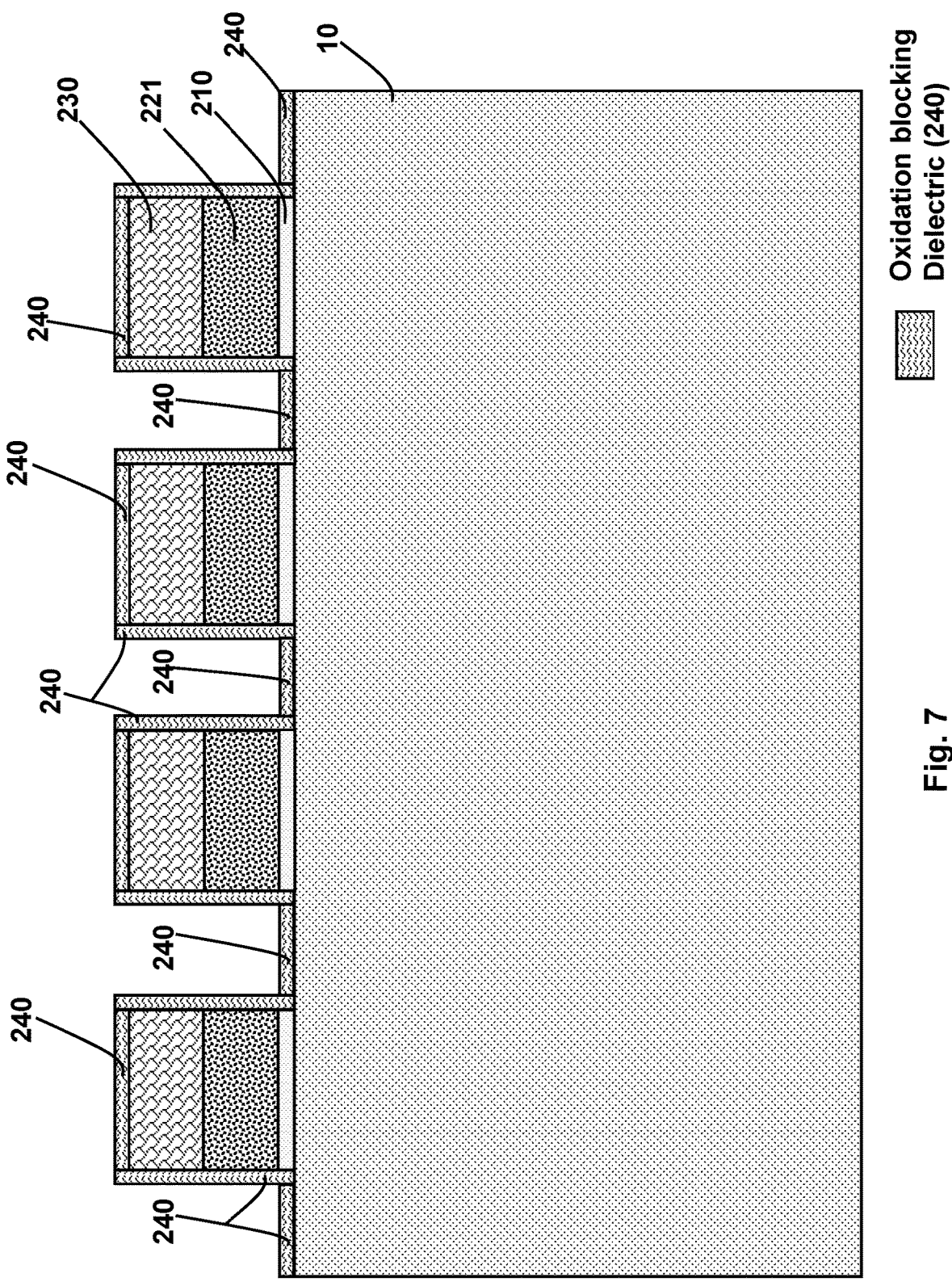
FIG. 7 shows the cross-section view in memory arrays after an oxidation blocking film 240 is conformally deposited on to the silicon surface according to this invention.
Figure 8:
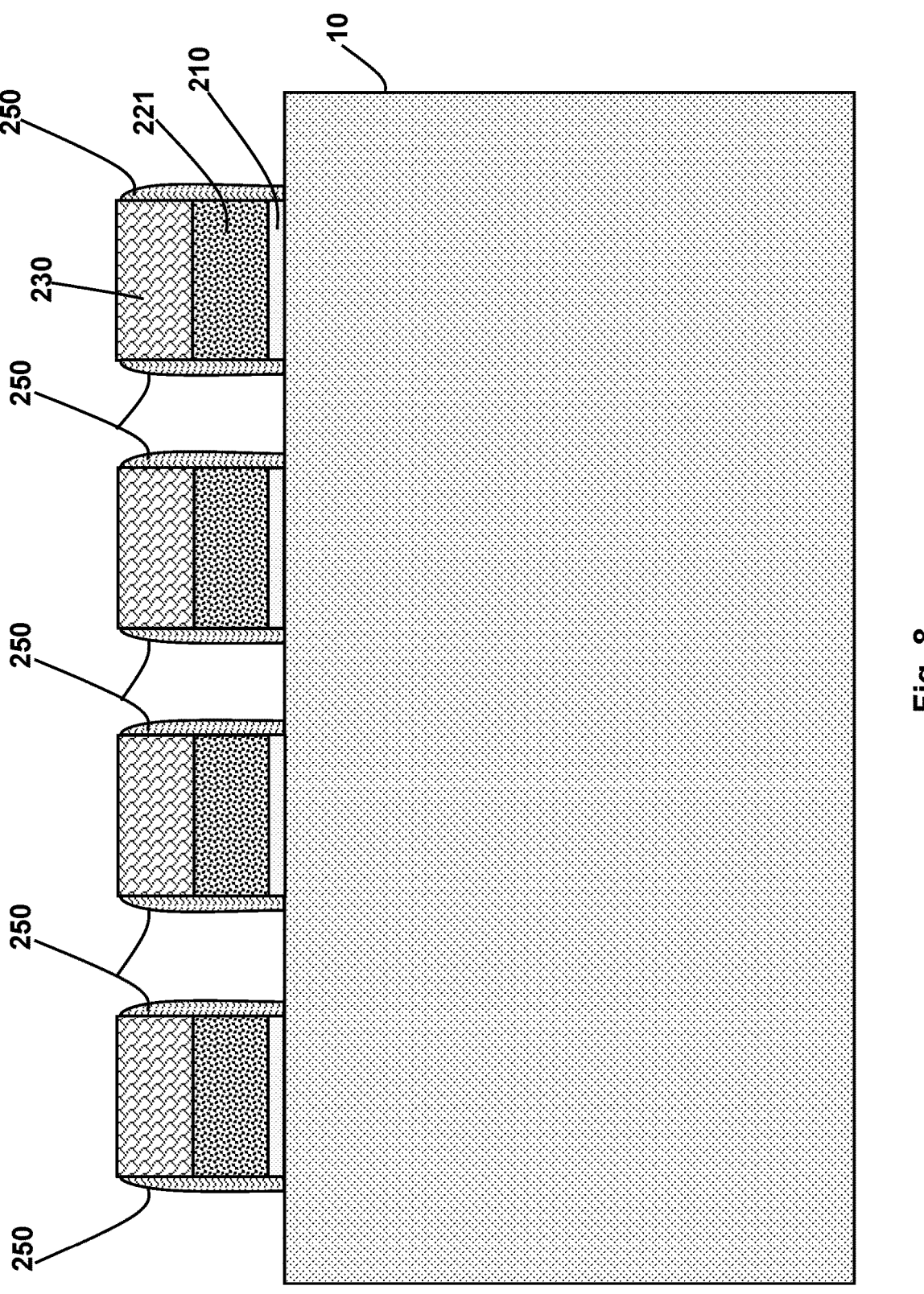
FIG. 8 shows the cross-section view in memory arrays after the oxidation blocking film 240 is etched to form spacers 250 along the side walls of floating-gates 221 according to this invention.
Figure 9:
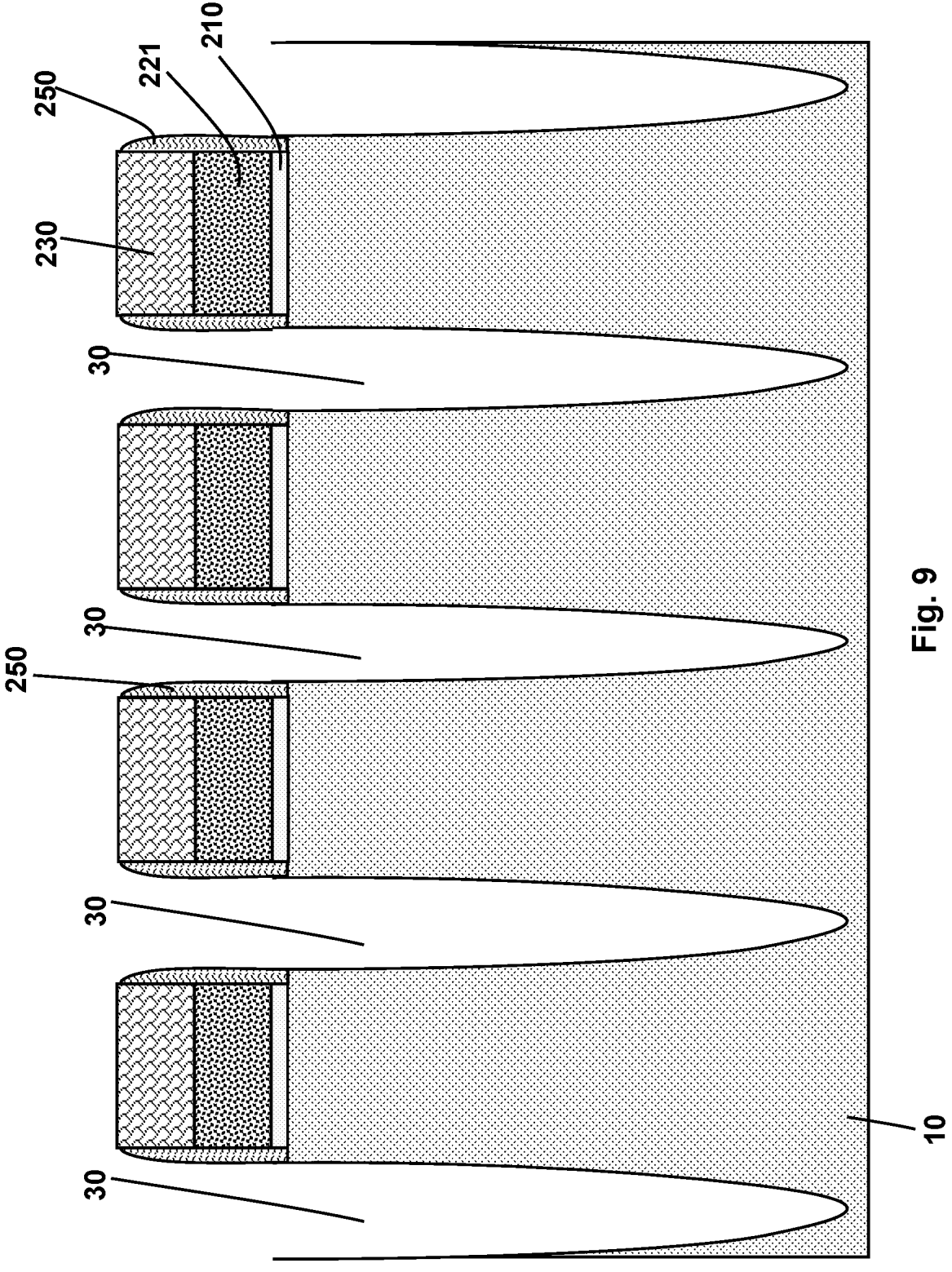
FIG. 9 shows the cross-section view in memory arrays after the self-aligned floating-gates/STI etch according to the invention.
Figure 10:
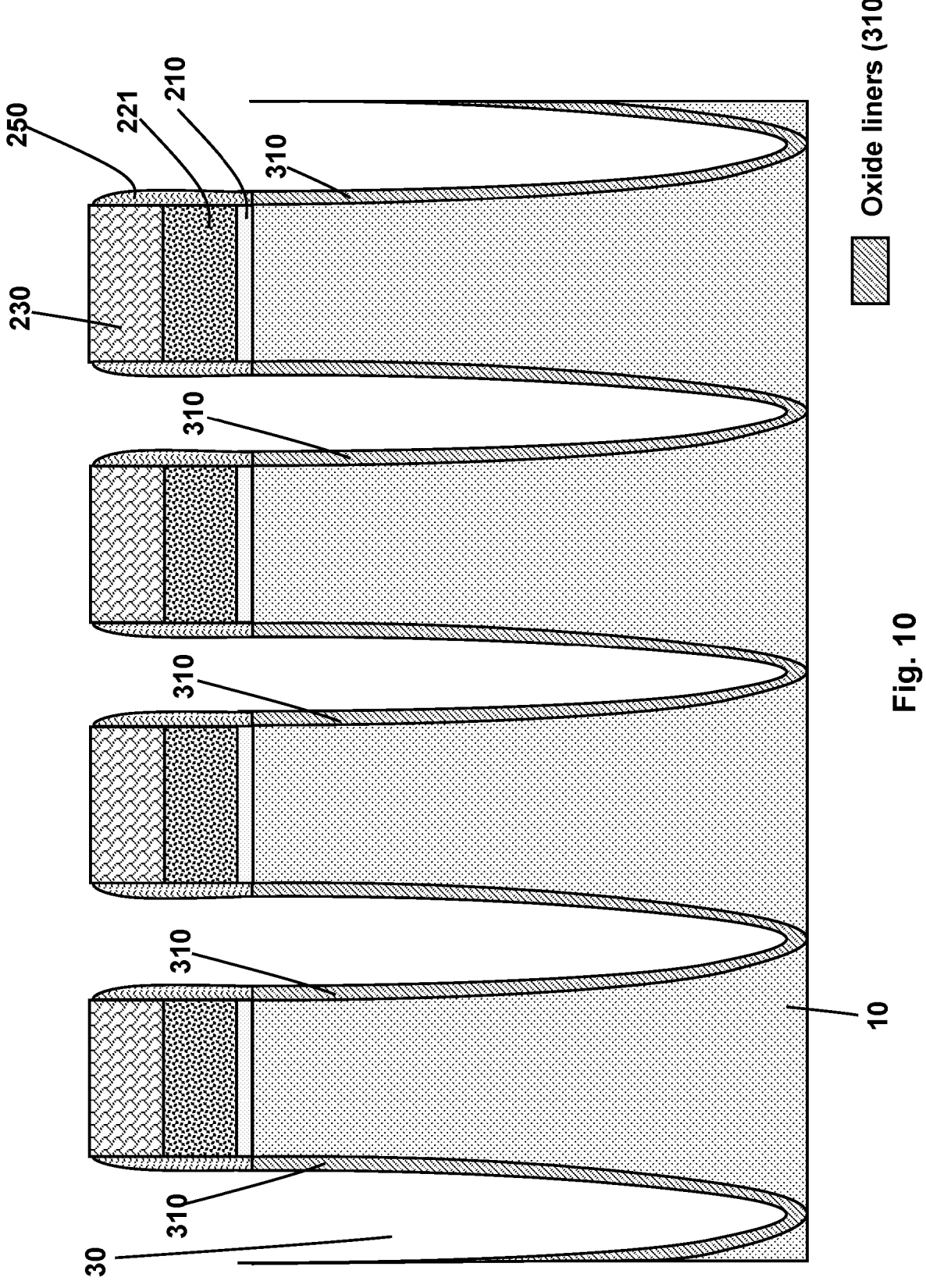
FIG. 10 shows the cross-section view in memory arrays after the formation of trench oxide liners 310 according to this invention.
Figure 11:
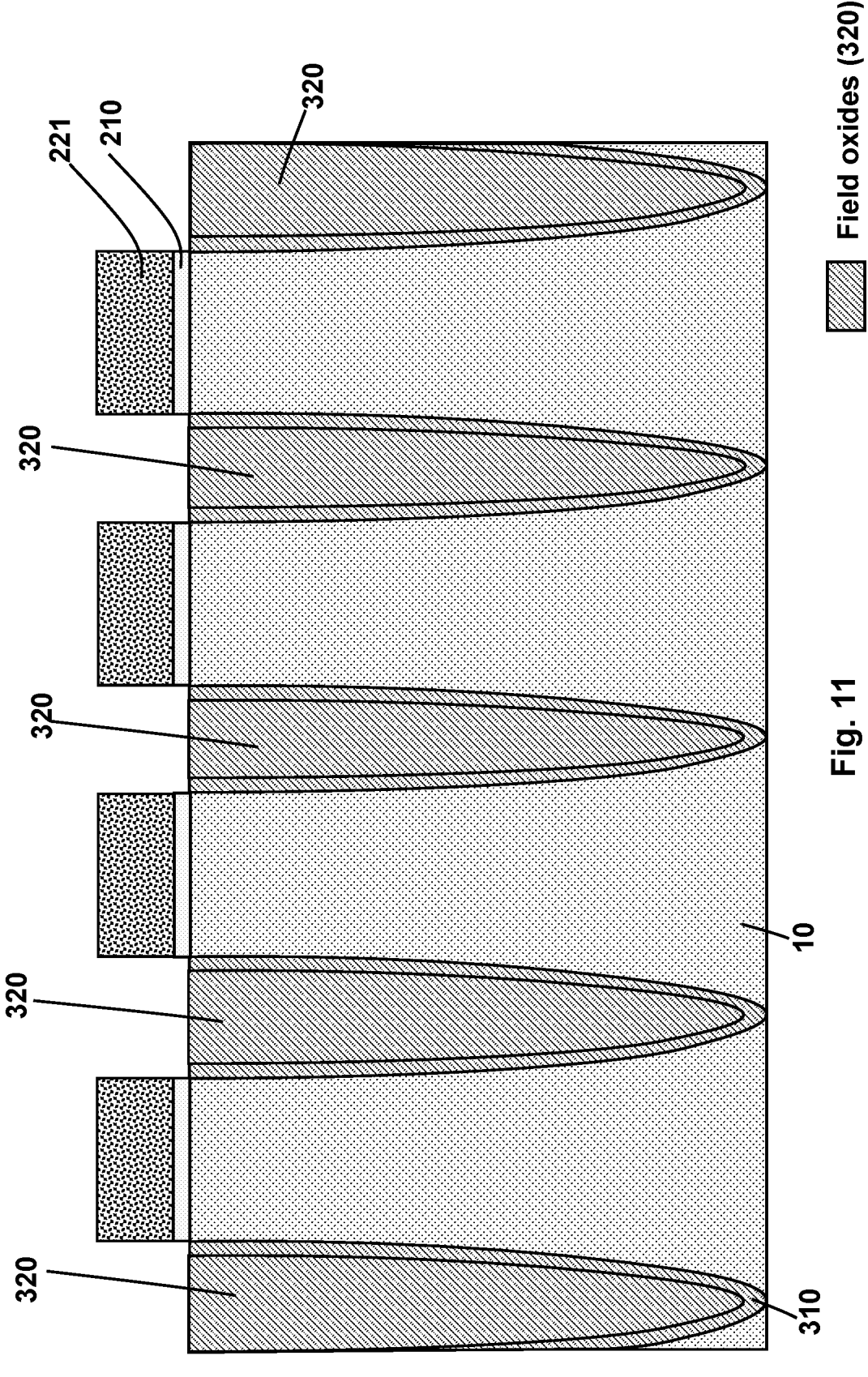
FIG. 11 shows the cross-section view in memory arrays after completion of the self-aligned floating-gates/STI process according to this invention.
Figure 12:
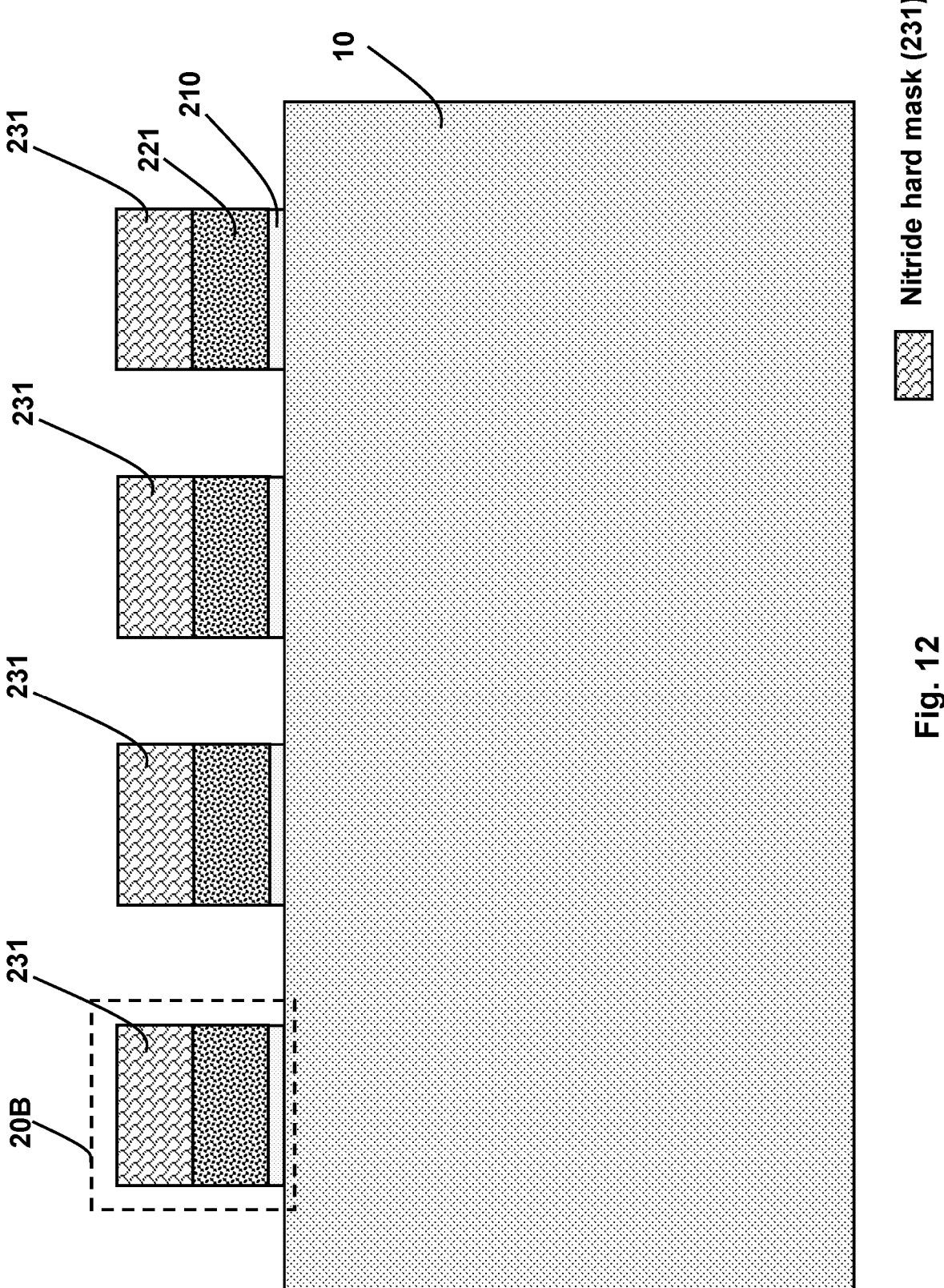
FIG. 12 shows the cross-section view in memory arrays after hard mask patterning/etch and poly-silicon/tunneling oxide etch for nitride film 231 as the hard mask material according to an embodiment of this invention.
Figure 13:
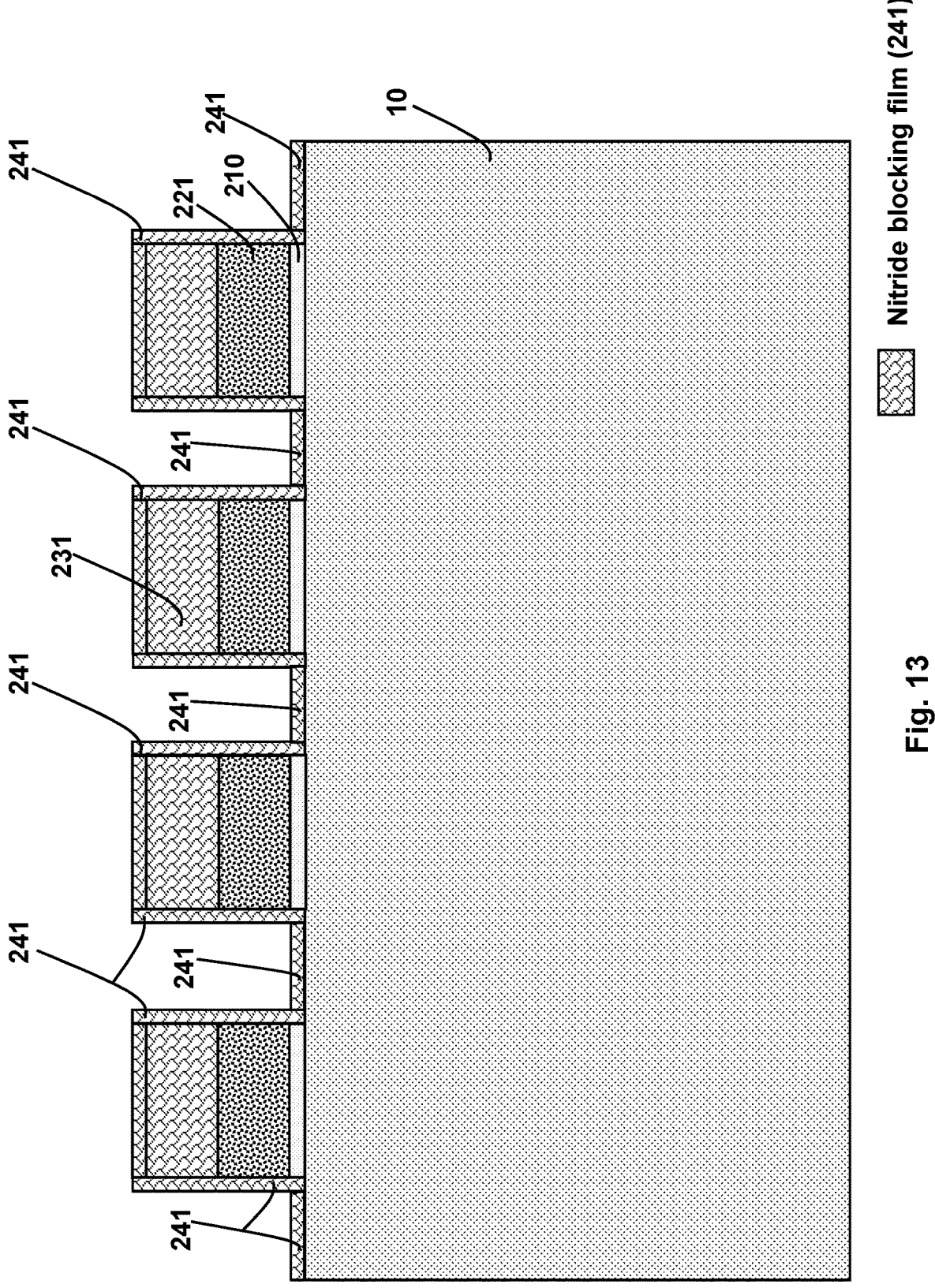
FIG. 13 shows the cross-section view in memory arrays after a nitride film 241 conformally deposited on to the silicon surface according to an embodiment of this invention.
Figure 14:
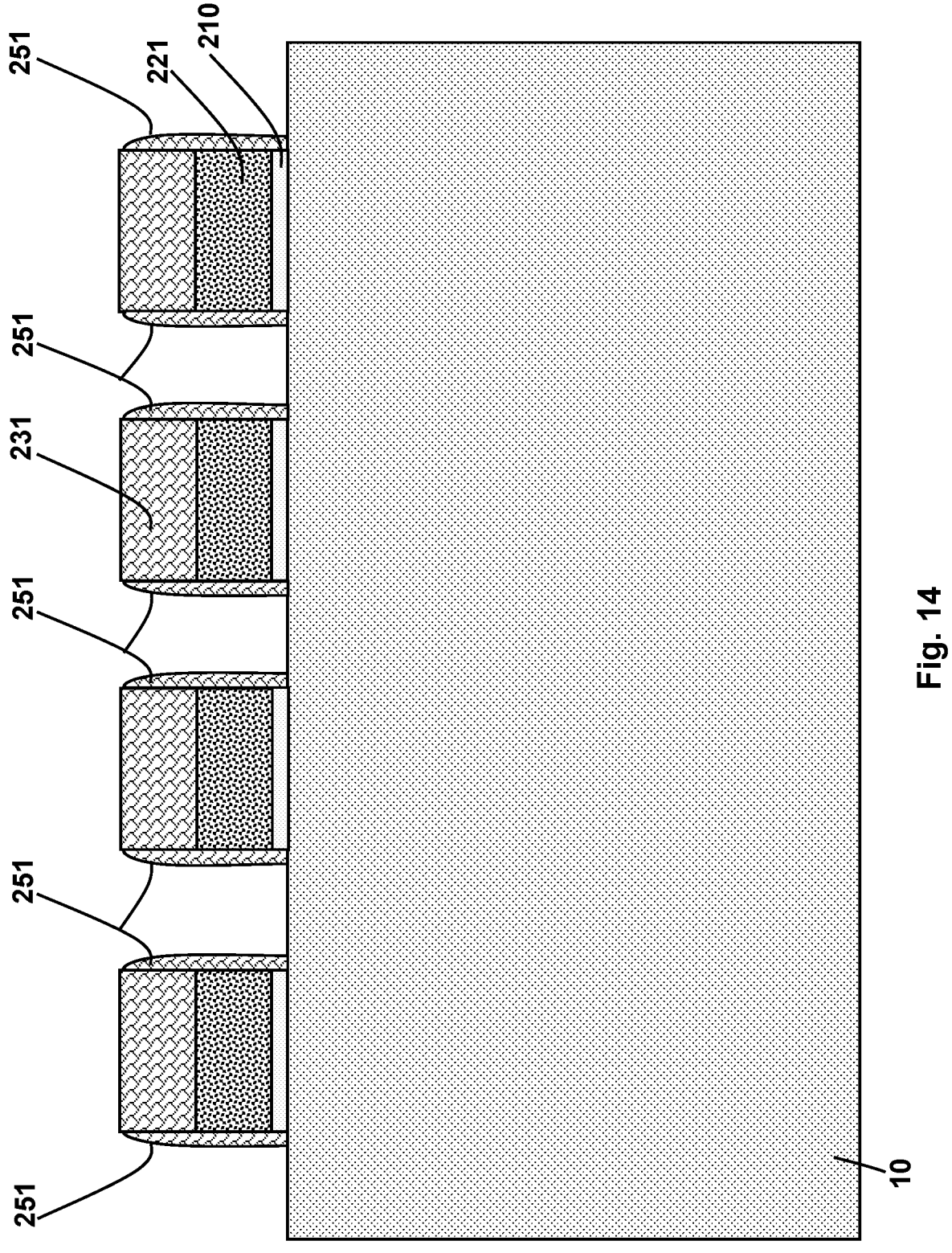
FIG. 14 shows the cross-section view in memory arrays after the nitride film 241 is etched to form nitride spacers 251 along the side walls of floating-gates 221 according to an embodiment of this invention.
Figure 15:
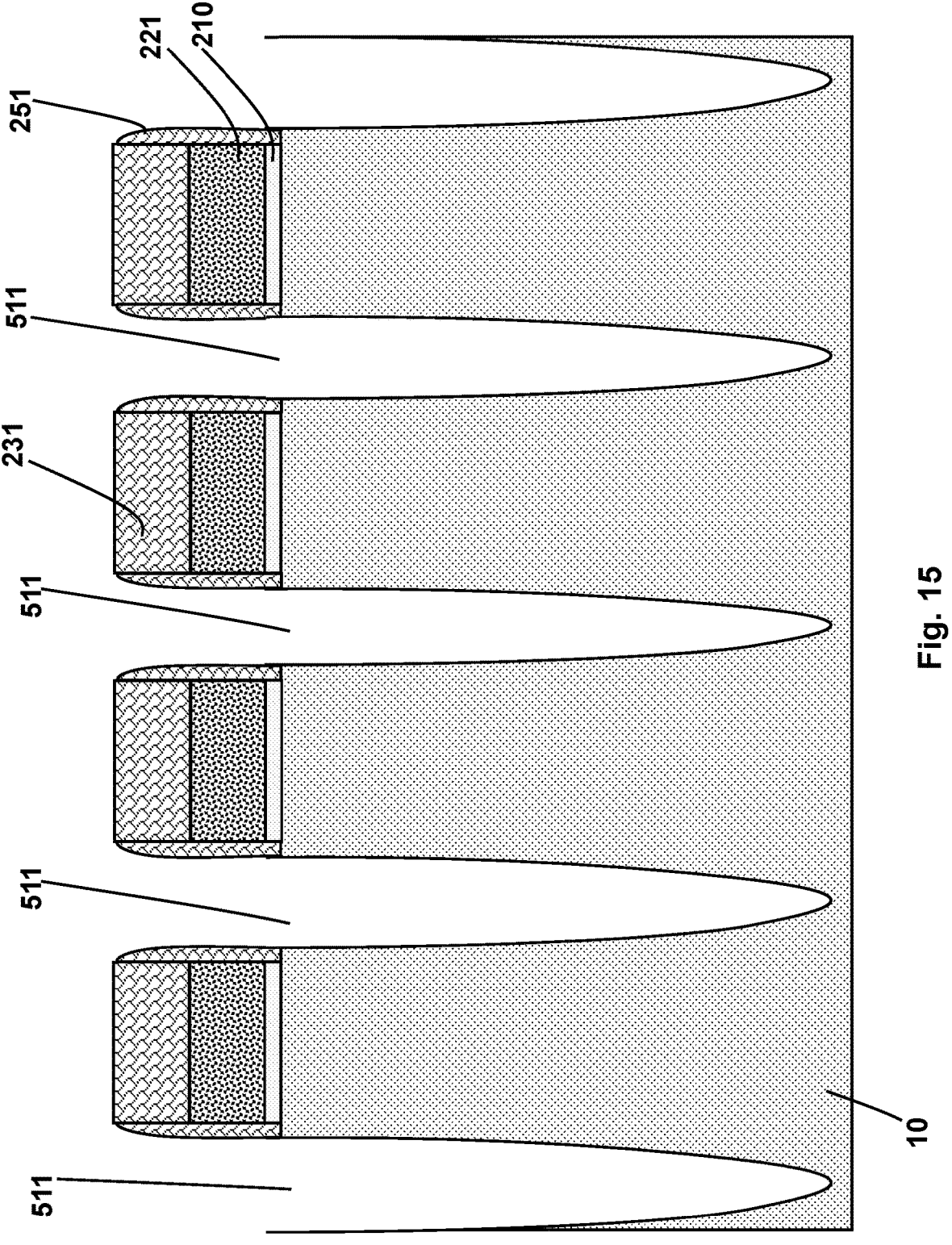
FIG. 15 shows the cross-section view in memory arrays after the self-aligned floating-gates/STI etch according to an embodiment of this invention.
Figure 16:
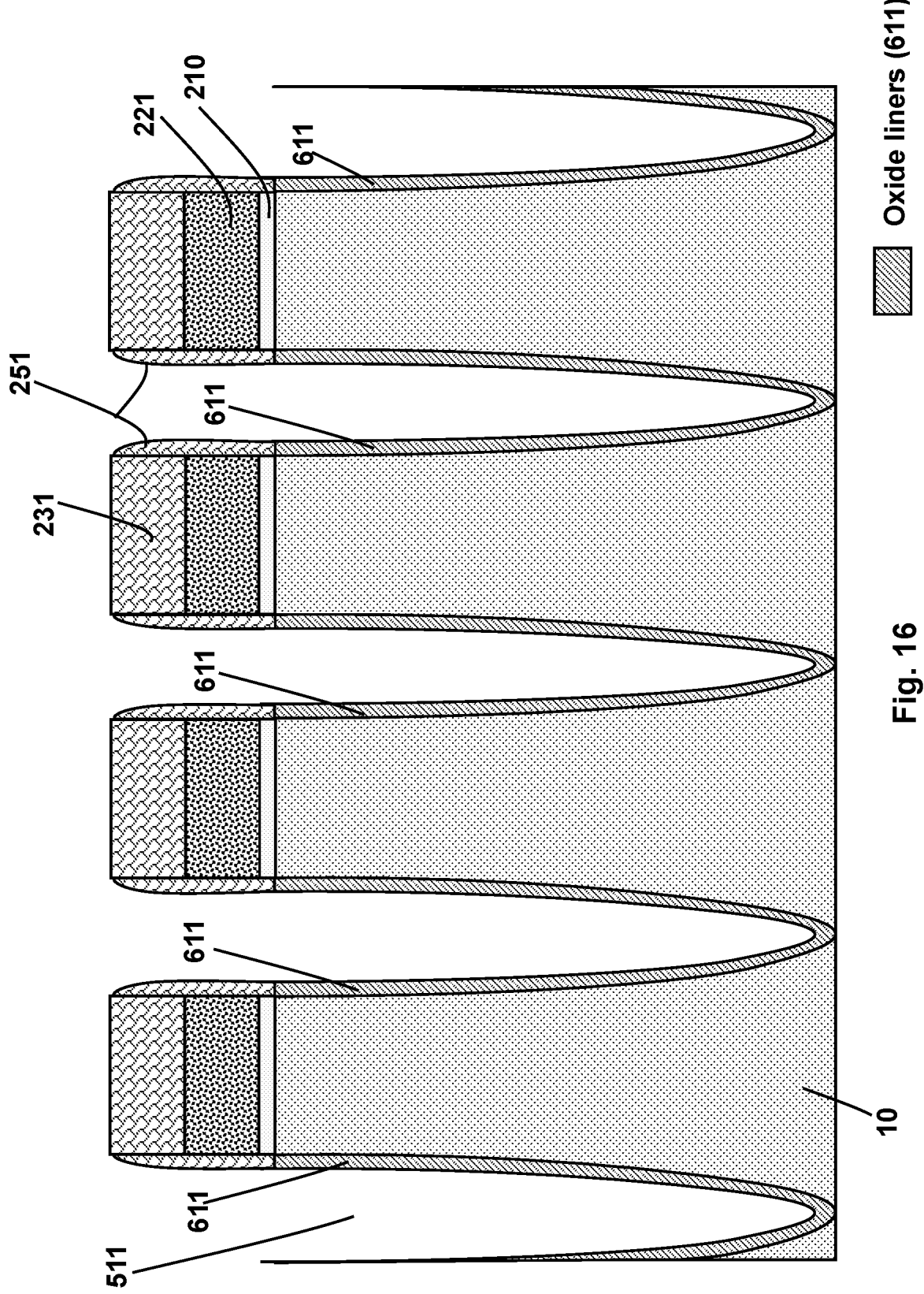
FIG. 16 shows the cross-section view in memory arrays after the formation of trench oxide liners 611 according to an embodiment of this invention.
Figure 17:
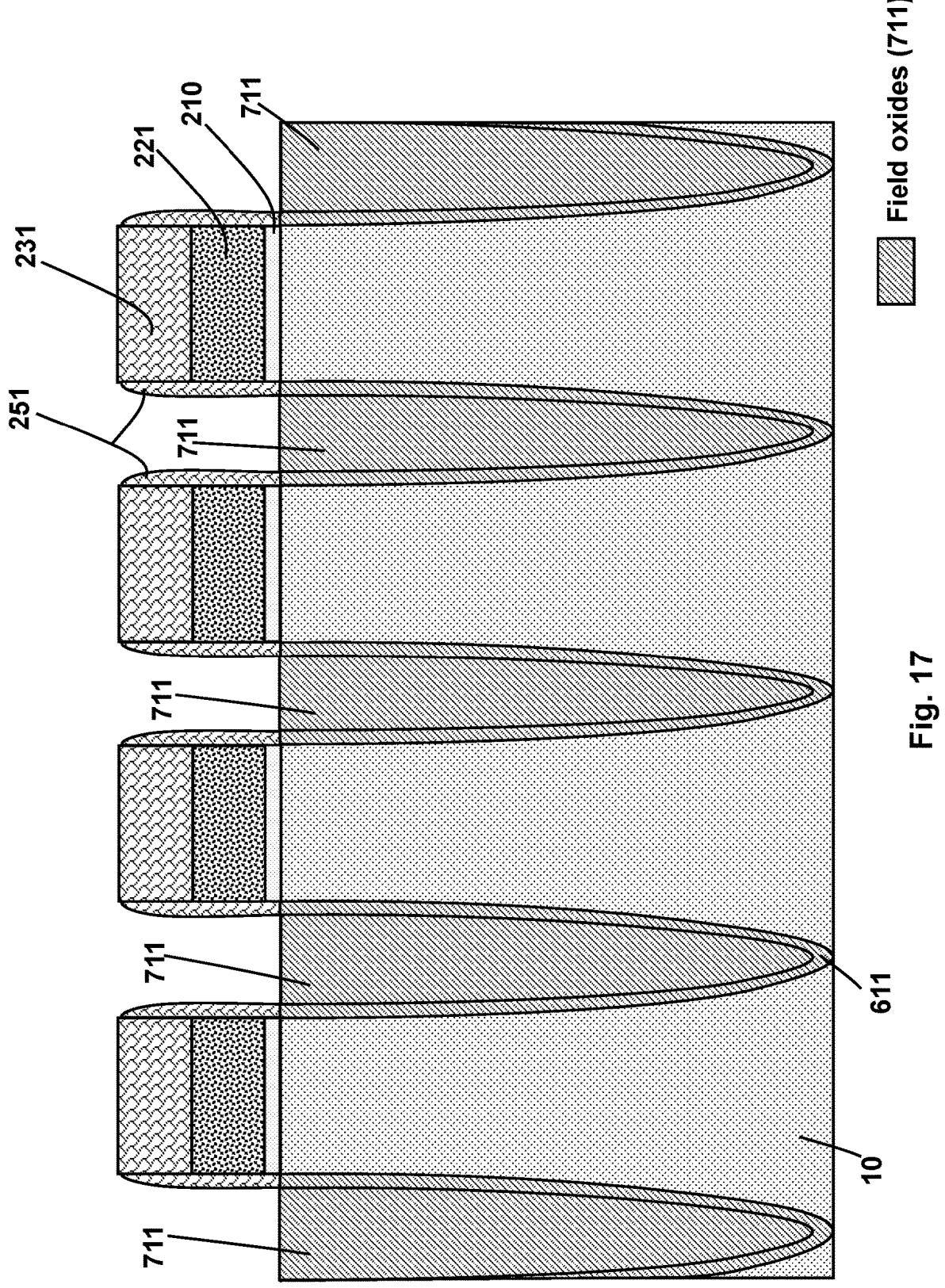
FIG. 17 shows the cross-section view in memory arrays after trench oxide fill, CMP, and field oxide recess etch according to an embodiment of this invention.
Figure 18:
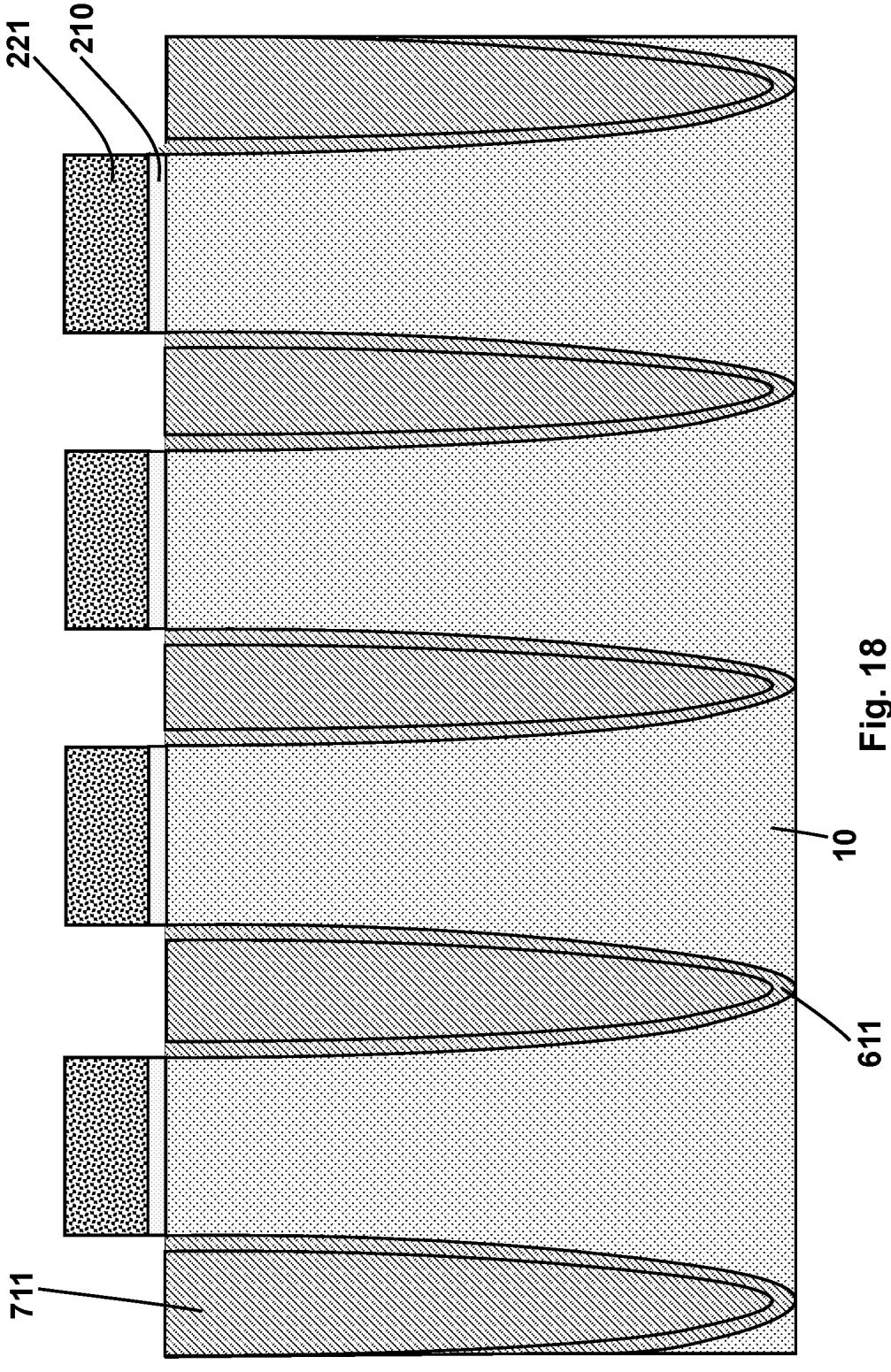
FIG. 18 shows the cross-section view in memory arrays after completion of the self-aligned floating-gates/STI process according to an embodiment of this invention.

In one embodiment, we apply nitride films for the hard mask material 230 and oxidation blocking material 240 in FIG. 7. It is known that nitride film is a good oxidation blocking material to block oxygen diffusion through nitride film into poly-silicon for oxidation during the high temperature silicon-dioxide grown process. In the embodiment, after nitride hard mask 231 with a depth of 600 angstroms to 1000 angstroms is deposited on the silicon surface 10 and then etched into patterns of the floating-gate/STI mask to leave a patterned nitride hard mask (not shown), the cross-section view in arrays is shown in FIG. 12. After applying the RIE to etch poly-silicon 221 and tunneling oxide 210 stopping at silicon substrate 10 based on the patterned nitride hard mask to form multiple parallel and space-apart stacked structures 20B, another nitride blocking film 241 with a thickness of 30 angstroms to 100 angstroms is conformally deposited on the silicon surface 10 as shown in FIG. 13. Then the first RIE for etching nitride film stopping at silicon substrate 10 is applied to etch the nitride blocking film 241 to form the oxidation blocking nitride spacers 251 along the floating-gate side walls (or the side walls of the stacked structures 20B) shown in FIG. 14. The second RIE continues to etch silicon substrate 10 to form shallow trenches 511 shown in FIG. 15. The silicon wafer is then taken for the silicon oxidation process to form the trench oxide liners 611 on the trenches' silicon walls as shown in FIG. 16. Note that due to the ultra-low permeability for oxygen diffusion into nitride film (231 & 251), the encapsulated floating-gate ploy-silicon 221 are not oxidized during the trench oxide liner formation process such that the shapes of floating-gates 221 and the tunneling oxide thickness are well preserved. Oxides are then deposited on wafer to fill the trenches 511 followed by a CMP process stopping at nitride hard mask 231 for flattening silicon surface around the height of nitride hard mask 231. An oxide recess etch process is then applied to etch the field oxides 711 to about the silicon substrate level as the cross-section view shown in FIG. 17. After nitride hard mask 231 and nitride spacers 251 are stripped for the completion of self-aligned floating-gate/STI process, the cross-section view of floating-gates and device active areas in memory arrays is shown in FIG. 18.

Figure 19:
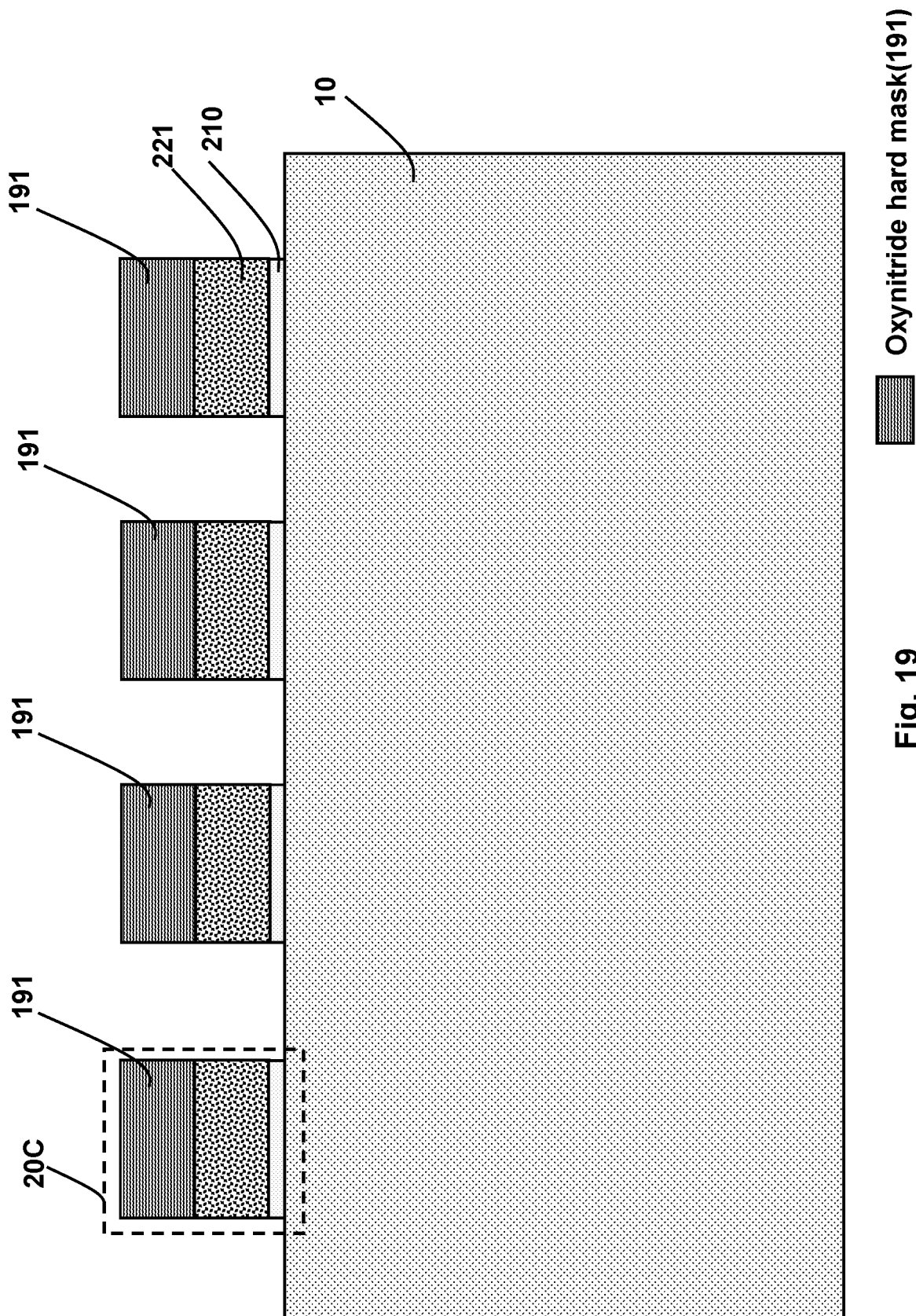
FIG. 19 shows the cross-section view in memory arrays after hard mask patterning/etch and poly-silicon/tunneling oxide etch for oxynitride film 191 as the hard mask material according to another embodiment of this invention.
Figure 20:
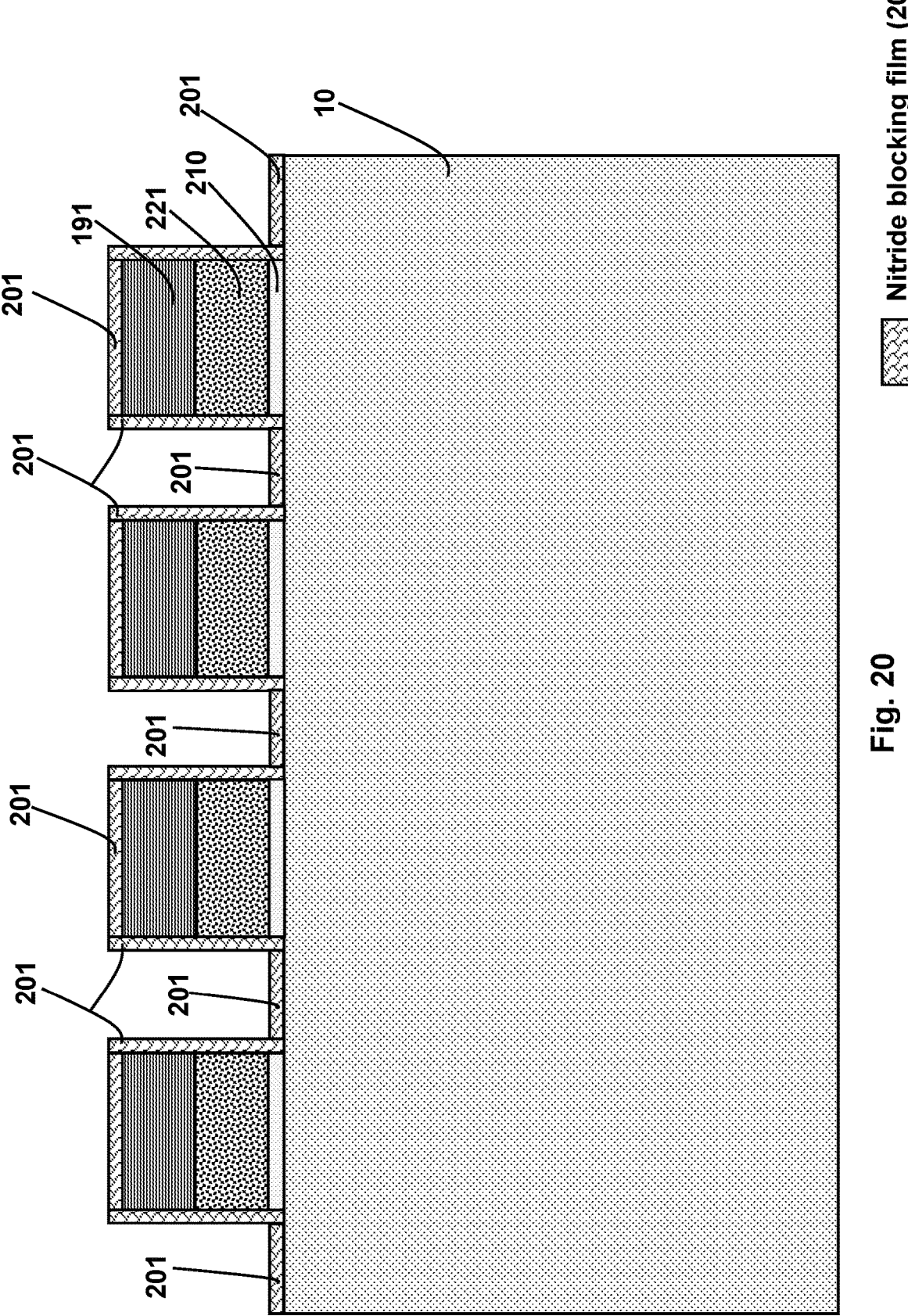
FIG. 20 shows the cross-section view in memory arrays after a nitride film 201 is conformally deposited on to the silicon surface according to another embodiment of this invention.
Figure 21:
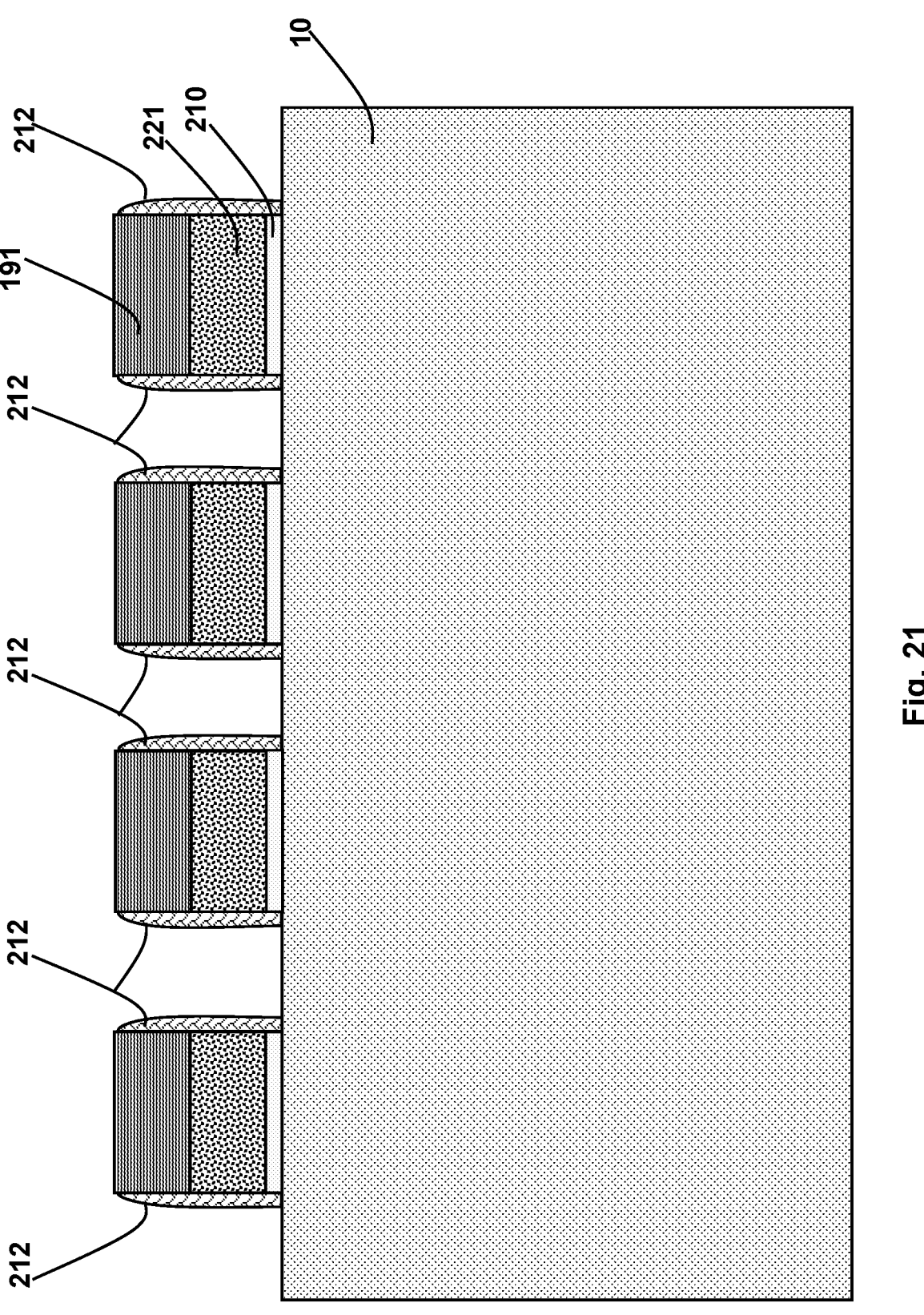
FIG. 21 shows the cross-section view in memory arrays after the nitride film 201 is etched to form nitride spacers 212 along the side walls of floating-gates 221 according to another embodiment of this invention.
Figure 22:
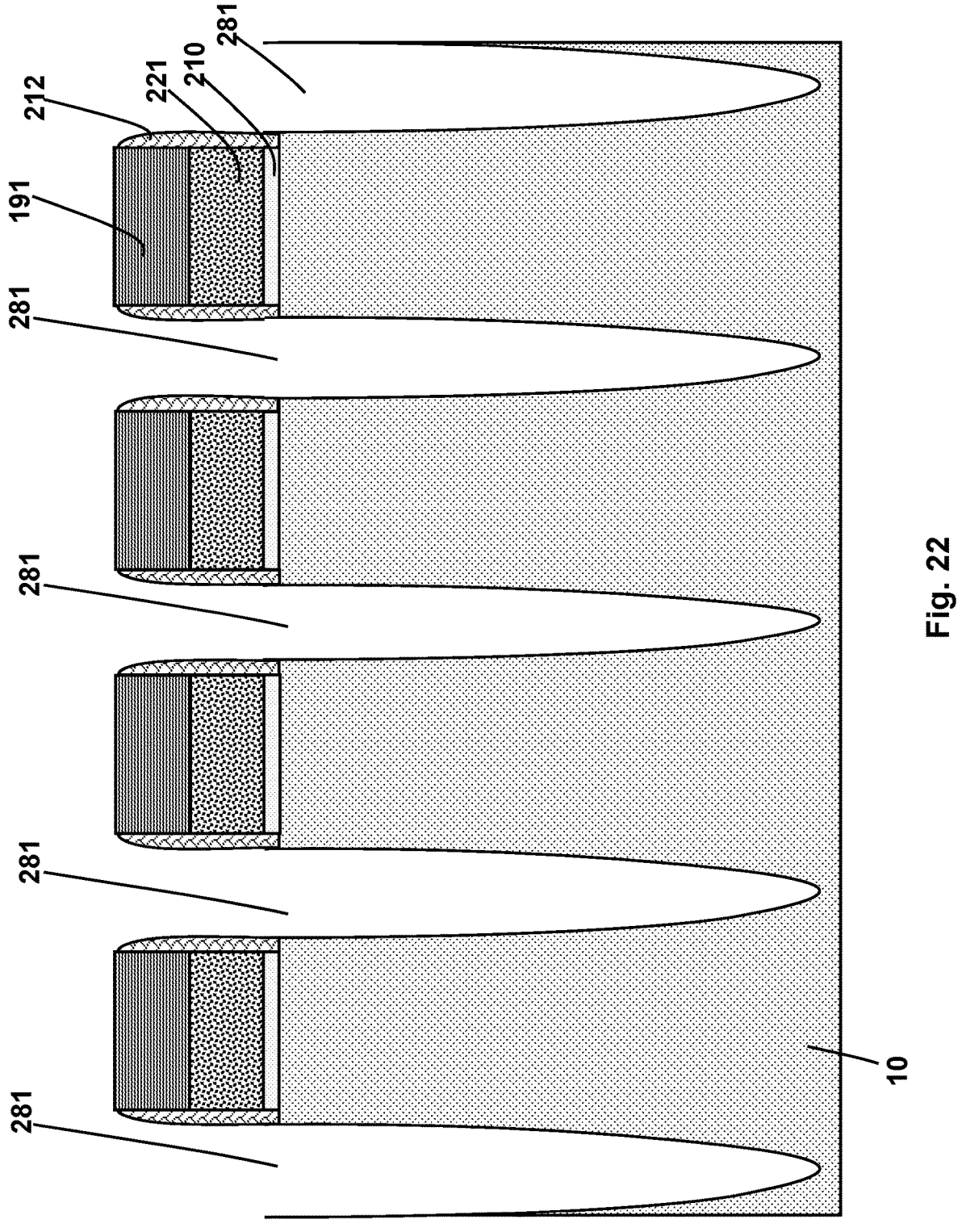
FIG. 22 shows the cross-section view in memory arrays after the self-aligned floating-gates/STI etch according to another embodiment of this invention.
Figure 23:
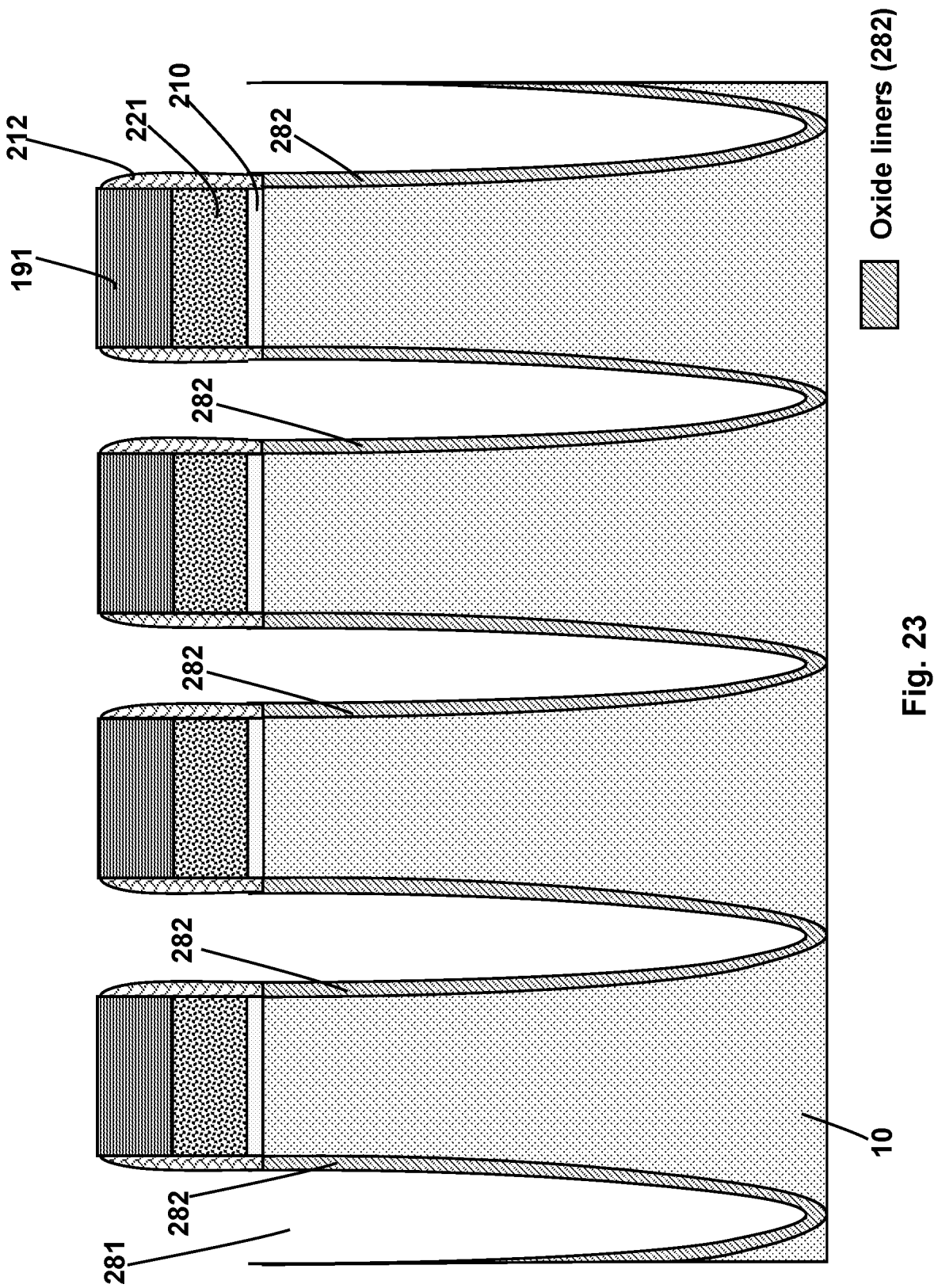
FIG. 23 shows the cross-section view in memory arrays after the formation of trench oxide liners 282 according to another embodiment of this invention.
Figure 24:
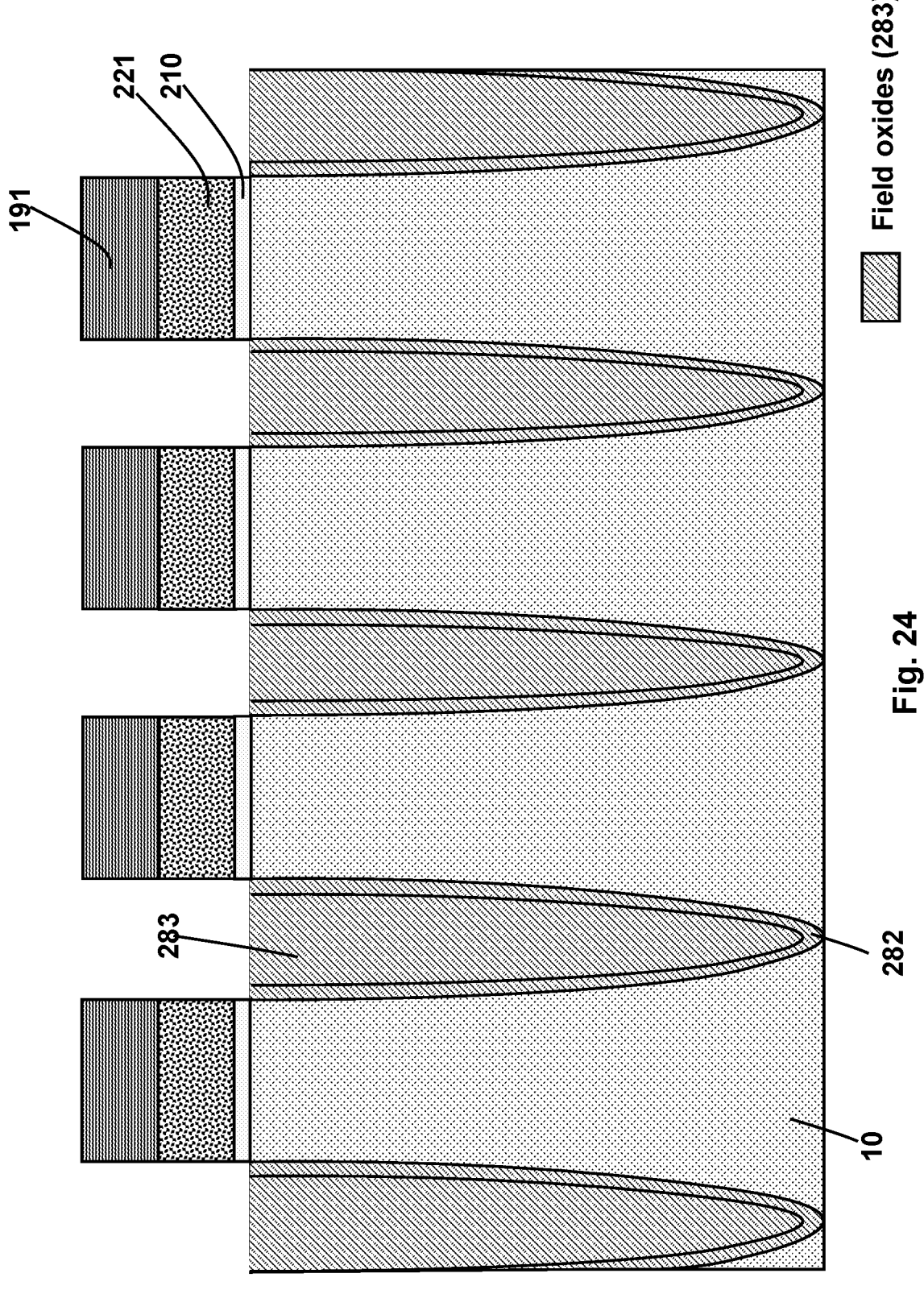
FIG. 24 shows the cross-section view in memory arrays after nitride spacer strip, trench oxide fill, CMP, and field oxide recess etch according to another embodiment of this invention.
Figure 25:
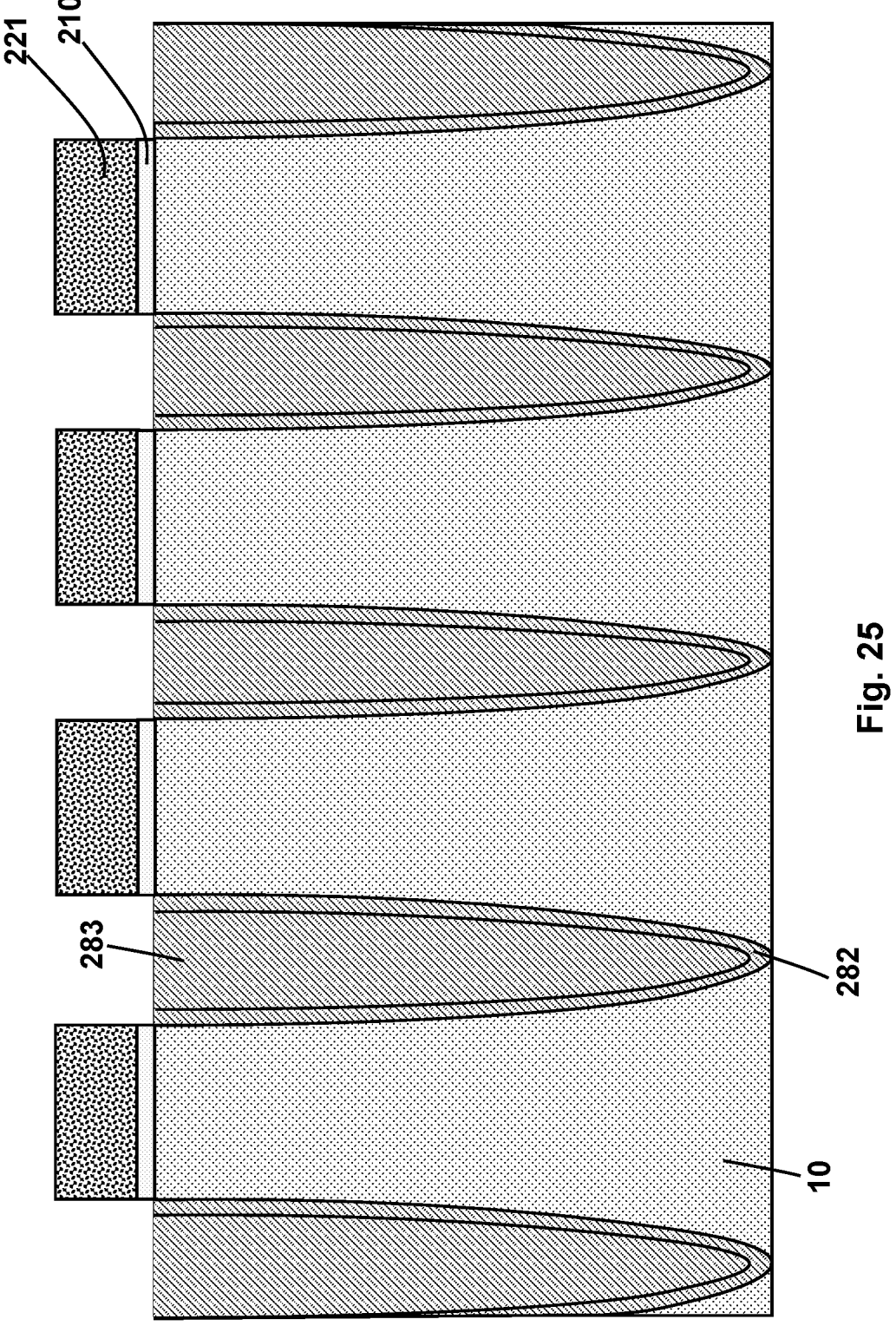
FIG. 25 shows the cross-section view in memory arrays after oxynitride strip for the completion of the self-aligned floating-gates/STI process according to another embodiment of this invention.

In another embodiment, we apply oxynitride for the hard mask material 230 and nitride for the spacer material 240 in FIG. 7. It is known that oxynitride and nitride can block oxygen diffusion through oxynitride and nitride films into poly-silicon during the high temperature silicon-dioxide grown process. In this embodiment, after oxynitride hard mask 191 with a depth of 600 angstroms to 1000 angstroms etched into patterns of the floating-gate/STI mask to leave a patterned oxynitride hard mask (not shown), the cross-section view in arrays is shown in FIG. 19. After applying the RIE sequence for etching poly-silicon 221 and tunneling oxide 210 stopping at the silicon substrate 10 based on the patterned oxynitride hard mask to form multiple parallel and space-apart stacked structures 20C, a nitride blocking film 201 with a thickness of 30 angstroms to 100 angstroms is conformally deposited on the silicon surface as shown in FIG. 20. The first RIE for etching the nitride blocking film 201 stopping at silicon substrate 10 is applied to etch the nitride blocking film 201 to form the nitride spacers 212 along the floating-gate side walls shown in FIG. 21. The second RIE for etching silicon substrate is applied to etch the silicon substrate 10 to form shallow trenches 281 in silicon substrate as shown in FIG. 22. The silicon wafer is then taken for silicon oxidation process to form the trench oxide liners 282 on the trenches' silicon walls as shown in FIG. 23. Note that due to the ultra-low permeability for oxygen diffusion in oxynitride and nitride, the encapsulated floating-gate ploy-silicon 221 are not oxidized during the trench oxide liner formation process such that the shapes of floating-gates 221 and the tunneling oxide thickness are well preserved. The nitride spacers 212 is then stripped followed by an oxide film deposition to fill the isolation trenches 281. A CMP process stopping at oxynitride hard mask 191 is applied to flatten the silicon surface followed by oxide recess etch process to etch the field oxides 283 to the silicon substrate level as the cross-section view in memory arrays shown in FIG. 24. Finally, FIG. 25 shows the cross-section view of floating-gate and device active areas in memory arrays after oxynitride hard mask 191 stripped for the completion of self-aligned floating-gate/STI process.

The aforementioned description of the preferred embodiment of the invention has been presented for purposes of illustration and description. It is not intended to be exhaustive or to limit the invention to the precise form or to exemplary embodiment disclosed. Accordingly, the description should be regarded as illustrative rather than restrictive. The embodiment is chosen and described in order to best explain the principles of the invention and its best mode practical application, thereby to enable persons skilled in the art to understand the invention for various embodiment and with various modifications as are suited to the particular use or implementation contemplated. It is intended that the scope of the invention be defined by the claims appended hereto and their equivalents in which all terms are meant in their broadest reasonable sense unless otherwise indicated. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiment of the invention. It should be appreciated that variations may be made in the embodiment described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method for forming floating gates in a non-volatile memory (NVM) array, comprising:

providing a substrate having a first insulating layer, a conductive layer and a hard-mask dielectric layer forming thereon in sequence;

patterning and etching portions of the hard-mask dielectric layer, the conductive layer and the first insulating layer to define multiple stacked structures over the substrate based on a floating-gate mask, wherein the multiple stacked structures are parallel and spaced-apart;

conformally depositing a spacer dielectric layer over the substrate;

etching a portion of the spacer dielectric layer to form multiple spacers along sidewalls of each stacked structure:

etching a portion of the substrate to form multiple trenches so that the multiple trenches and the multiple stacked structures are alternately arranged in each row;

growing multiple liners on silicon walls of the multiple trenches by oxidation;

wherein for each stacked structure, the conductive layer is encapsulated in the hard-mask dielectric layer and the multiple spacers so that the conductive layer is not oxidized during the step of growing the multiple liners on the silicon walls of the multiple trenches by the oxidation;

wherein a shape of the conductive layer and a thickness of the first insulating layer for each stacked structure are preserved during the step of growing the multiple liners on the silicon walls of the multiple trenches by the oxidation; and wherein the hard-mask dielectric layer and the spacer dielectric layer comprise an oxidation-blocking material.

2. The method according to claim 1, wherein the hard-mask dielectric layer and the spacer dielectric layer comprise nitride.

3. The method according to claim 2, further comprising: after the step of growing, depositing a second insulating layer on the substrate to fill the multiple trenches;

planarizing the substrate surface by removing any portion of the second insulating layer above the hard-mask dielectric layer;

etching any portion of the second insulating layer above the substrate; and removing the hard-mask dielectric layer and the multiple spacers for each stacked structure after the step of etching any portion of the second insulating layer.

4. The method according to claim 1, wherein the hard-mask dielectric layer comprises oxynitride and the spacer dielectric layer comprises nitride.

5. The method according to claim 4, further comprising: after the step of growing, removing the multiple spacers for each stacked structure;

depositing a second insulating layer on the substrate to fill the multiple trenches after the step of removing the multiple spacers;

planarizing the substrate surface by removing any portion of the second insulating layer above the hard-mask dielectric layer;

etching any portion of the second insulating layer above the substrate; and removing the hard-mask dielectric layer for each stacked structure after the step of etching any portion of the second insulating layer.

6. The method according to claim 1, which is applicable to the NVM array comprising multiple floating-gate NVM devices whose cell device sizes are scaled down to minimum feature sizes provided by nanometer fabrication process technology.

7. The method according to claim 1, wherein the step of patterning and etching comprises:

patterning and etching the hard-mask dielectric layer based on the floating-gate mask to leave a patterned hard mask over the conducting layer; and etching the conducting layer and the first insulating layer through the patterned hard mask to define the multiple stacked structures over the substrate.

* * * * *